United States Patent
Kumano et al.

(10) Patent No.: US 10,560,122 B2
(45) Date of Patent: Feb. 11, 2020

(54) MEMORY SYSTEM AND METHOD OF CONTROLLING NONVOLATILE MEMORY

(71) Applicant: Toshiba Memory Corporation, Minato-ku (JP)

(72) Inventors: Yuta Kumano, Kawasaki (JP); Yoshiyuki Sakamaki, Kawasaki (JP); Hironori Uchikawa, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 45 days.

(21) Appl. No.: 15/919,788

(22) Filed: Mar. 13, 2018

(65) Prior Publication Data

US 2019/0089377 A1 Mar. 21, 2019

(30) Foreign Application Priority Data

Sep. 20, 2017 (JP) .................. 2017-180631

(51) Int. Cl.
*H03M 13/11* (2006.01)
*H03M 13/25* (2006.01)
(Continued)

(52) U.S. Cl.
CPC ..... *H03M 13/1171* (2013.01); *G06F 11/1068* (2013.01); *G06F 17/16* (2013.01);
(Continued)

(58) Field of Classification Search
CPC ........... H03M 13/1182; H03M 13/611; H03M 13/1171; H03M 13/1174; H03M 13/152;
(Continued)

(56) References Cited

U.S. PATENT DOCUMENTS

| | | | |
|---|---|---|---|
| 5,430,744 A * | 7/1995 | Fettweis | H03M 13/3961 375/290 |
| 2003/0014379 A1* | 1/2003 | Saias | G06Q 10/06 706/45 |

(Continued)

OTHER PUBLICATIONS

Tom Hoholdt, et al. "Graph Codes with Reed-Solomon Component Codes", in Proc. IEEE International Symposium on Information Theory, pp. 2022-2026, 2006.

(Continued)

*Primary Examiner* — Guy J Lamarre
(74) *Attorney, Agent, or Firm* — Oblon, McClelland, Maier & Neustadt, L.L.P.

(57) ABSTRACT

According to one embodiment, a memory system comprises an encoder that encodes by a graph code and a data holding unit that holds data to be used in encoding. A check matrix of the graph code includes first to sixth submatrices, and the encoder produces a first vector obtained by multiplying an information word and the first submatrix, produces a second vector obtained by multiplying the information word and the third submatrix, produces a third vector obtained by multiplying the first vector and the fifth submatrix inverted in sign, produces a fourth vector obtained by adding the third vector and the second vector, produces a first parity obtained by multiplying the fourth vector and the data, produces a fifth vector obtained by multiplying the first parity and the second submatrix inverted in sign, and produces a second parity obtained by adding the fifth vector and the first vector.

15 Claims, 23 Drawing Sheets

(51) Int. Cl.
*G06F 17/16* (2006.01)
*H03M 13/15* (2006.01)
*G06F 11/10* (2006.01)

(52) U.S. Cl.
CPC ..... *H03M 13/1174* (2013.01); *H03M 13/152* (2013.01); *H03M 13/255* (2013.01)

(58) Field of Classification Search
CPC ... H03M 13/255; G06F 11/1068; G06F 17/16
See application file for complete search history.

(56) References Cited

U.S. PATENT DOCUMENTS

| | | | | |
|---|---|---|---|---|
| 2005/0149833 | A1* | 7/2005 | Worley | H03M 13/19 714/781 |
| 2007/0162815 | A1 | 7/2007 | El-Khamy et al. | |
| 2008/0126908 | A1* | 5/2008 | Lin | H03M 13/1108 714/758 |
| 2008/0172592 | A1* | 7/2008 | Wehn | H03M 13/1111 714/758 |
| 2008/0189418 | A1* | 8/2008 | Kimbrel | G06F 9/5066 709/226 |
| 2009/0034661 | A1* | 2/2009 | Vontobel | H03M 13/1105 375/341 |
| 2012/0173947 | A1 | 7/2012 | Voicila et al. | |
| 2013/0024745 | A1 | 1/2013 | Sharon et al. | |
| 2017/0077958 | A1 | 3/2017 | Torii et al. | |
| 2017/0359148 | A1* | 12/2017 | Richardson | H03M 13/1148 |
| 2019/0190543 | A1* | 6/2019 | Young | H03M 13/616 |

OTHER PUBLICATIONS

Jorn Justesen "Performance of Product Codes and Related Structures with Iterated Decoding", IEEE Transactions on Communications, vol. 59, pp. 407-415, 2011.

Irina E. Bocharova, et al. "Woven Graph Codes: Asymptotic Performances and Examples", IEEE Transactions on Information Theory, vol. 56, pp. 121-129, 2010.

Thomas J. Richardson, et al. "Efficient Encoding of Low-Density Parity-Check Codes", IEEE Transactions on Information Theory, vol. 47, pp. 638-656, 2001.

Tong Zhang, et al. "A class of efficient-encoding generalized low-density parity-check codes", in Proc. IEEE International Conference on Acoustics, Speech, and Signal Processing, vol. 4, pp. 2477-2480, 2001.

* cited by examiner

FIG.3
START
↓
GENERATE ADJACENCY MATRIX OF GRAPH — S101
↓
NUMBER EDGES OF GRAPH DIVIDED INTO INFORMATION PART AND REDUNDANT PART — S102
↓
GENERATE INCIDENCE MATRIX OF GRAPH — S103
↓
END
FIG.4
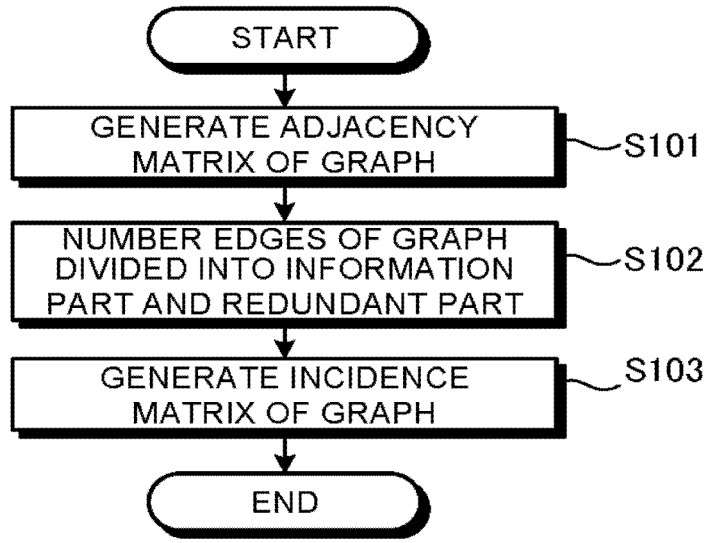
FIG.5
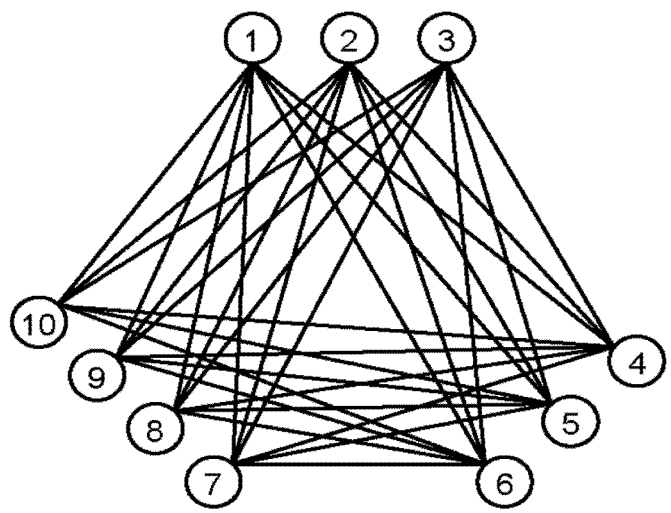

FIG.6
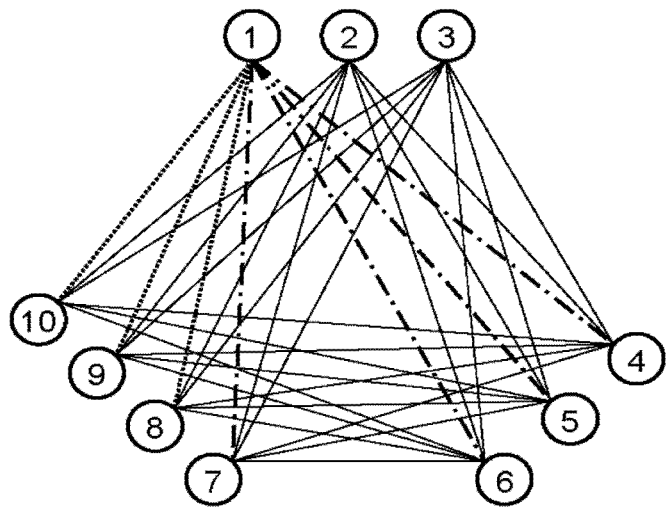
FIG.7
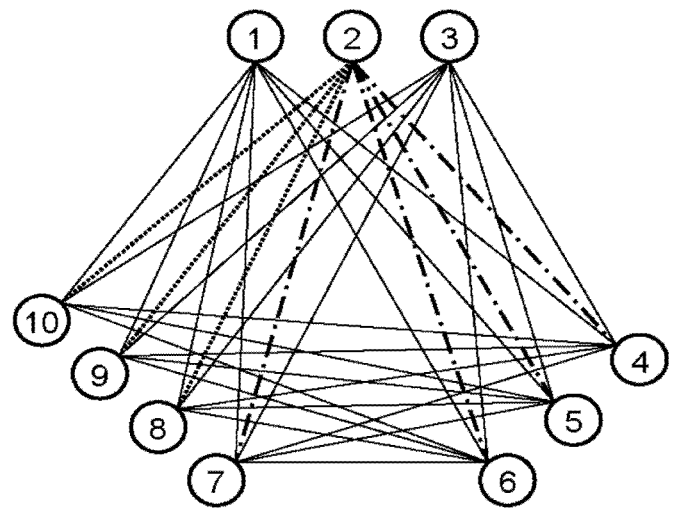
FIG.8
$$A_G = \begin{bmatrix} & 1 & 2 & 3 & 4 & 5 & 6 & 7 & 8 & 9 & 10 \\ 1 & 0 & 0 & 0 & 1 & 1 & 1 & 1 & 1 & 1 & 1 \\ 2 & 0 & 0 & 0 & 1 & 1 & 1 & 1 & 1 & 1 & 1 \\ 3 & 0 & 0 & 0 & 1 & 1 & 1 & 1 & 1 & 1 & 1 \\ 4 & 1 & 1 & 1 & 0 & 0 & 0 & 1 & 1 & 1 & 1 \\ 5 & 1 & 1 & 1 & 0 & 0 & 0 & 1 & 1 & 1 & 1 \\ 6 & 1 & 1 & 1 & 0 & 0 & 0 & 1 & 1 & 1 & 1 \\ 7 & 1 & 1 & 1 & 1 & 1 & 1 & 0 & 0 & 0 & 0 \\ 8 & 1 & 1 & 1 & 1 & 1 & 1 & 0 & 0 & 0 & 0 \\ 9 & 1 & 1 & 1 & 1 & 1 & 1 & 0 & 0 & 0 & 0 \\ 10 & 1 & 1 & 1 & 1 & 1 & 1 & 0 & 0 & 0 & 0 \end{bmatrix}$$

FIG.9
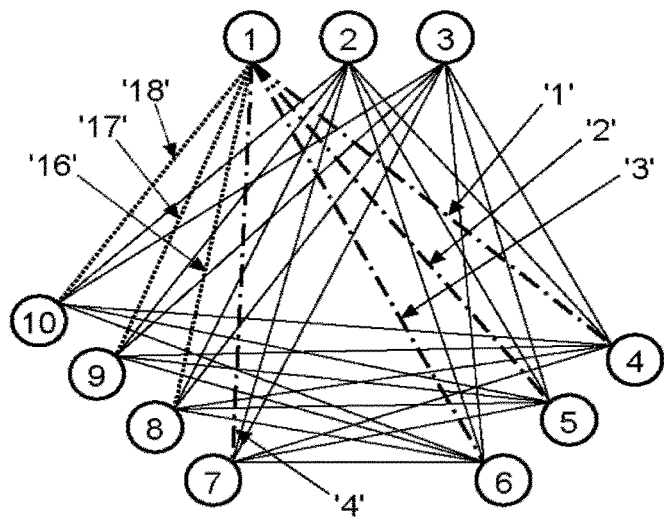
FIG.10
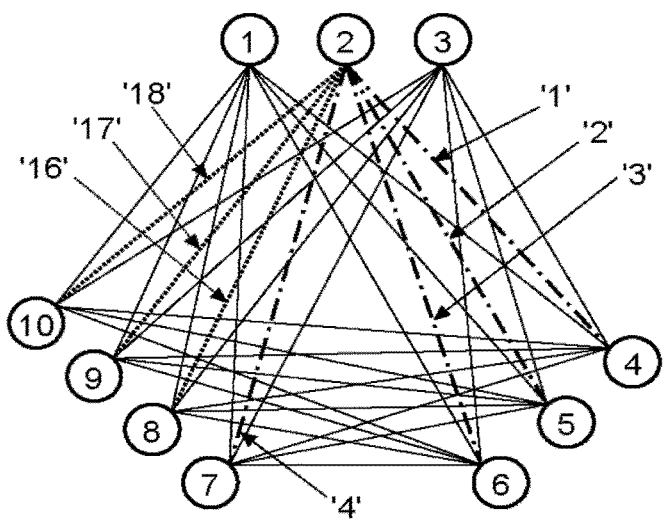
FIG.11
$$AG = \begin{array}{c} \\ 1 \\ 2 \\ 3 \\ 4 \\ 5 \\ 6 \\ 7 \\ 8 \\ 9 \\ 10 \end{array} \begin{bmatrix} 1 & 2 & 3 & 4 & 5 & 6 & 7 & 8 & 9 & 10 \\ 0 & 0 & 0 & 1 & 2 & 3 & 4 & 16 & 17 & 18 \\ 0 & 0 & 0 & 5 & 6 & 7 & 8 & 19 & 20 & 21 \\ 0 & 0 & 0 & 9 & 10 & 11 & 12 & 22 & 23 & 24 \\ 1 & 1 & 1 & 0 & 0 & 0 & 13 & 25 & 26 & 27 \\ 1 & 1 & 1 & 0 & 0 & 0 & 14 & 28 & 29 & 30 \\ 1 & 1 & 1 & 0 & 0 & 0 & 15 & 31 & 32 & 33 \\ 1 & 1 & 1 & 1 & 1 & 1 & 0 & 0 & 0 & 0 \\ 1 & 1 & 1 & 1 & 1 & 1 & 0 & 0 & 0 & 0 \\ 1 & 1 & 1 & 1 & 1 & 1 & 0 & 0 & 0 & 0 \\ 1 & 1 & 1 & 1 & 1 & 1 & 0 & 0 & 0 & 0 \end{bmatrix}$$
1101    1102

$$= \begin{bmatrix} 1 & 1 & 1 & 0 & 1 & 0 & 0 \\ 0 & 1 & 1 & 1 & 0 & 1 & 0 \\ 1 & 1 & 0 & 1 & 0 & 0 & 1 \end{bmatrix}$$

$$\underbrace{\phantom{1\ 1\ 1\ 0}}_{1301}\ \underbrace{\phantom{1\ 0\ 0}}_{1302}$$

$$= \begin{bmatrix} 1 & 1 & 0 & 1 & 0 & 0 \\ 1 & 1 & 1 & 0 & 1 & 0 \\ 1 & 0 & 1 & 0 & 0 & 1 \end{bmatrix}$$

$$\underbrace{\phantom{1\ 1\ 0}}_{1401}\ \underbrace{\phantom{1\ 0\ 0}}_{1402}$$

FIG.15

$$H = \begin{bmatrix} \text{matrix as shown} \end{bmatrix}$$

FIG.22

FIG. 25
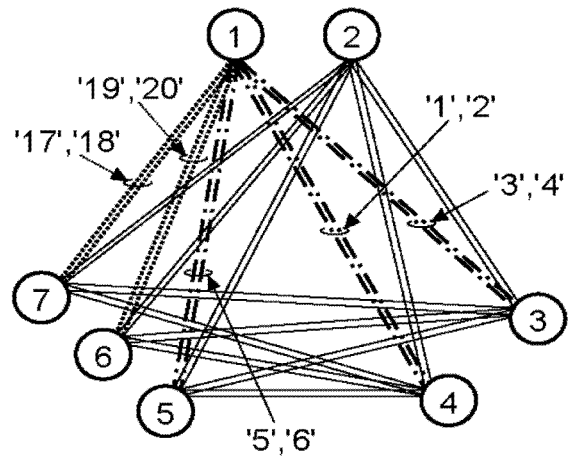
FIG. 26
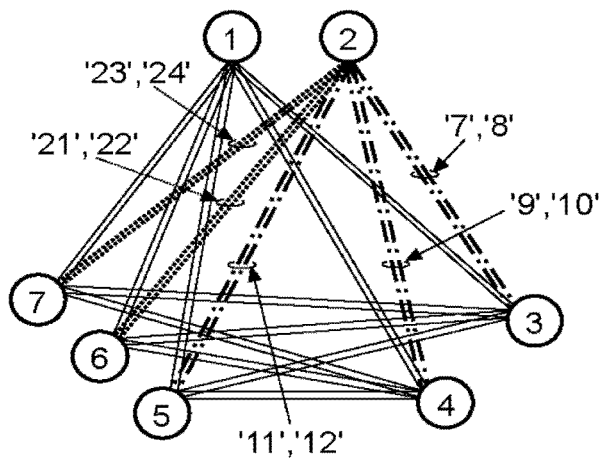
FIG. 27
$$\begin{array}{c} & \begin{array}{ccccccc} 1 & 2 & 3 & 4 & 5 & 6 & 7 \end{array} \\ \begin{array}{c} 1 \\ 2 \\ 3 \\ 4 \\ 5 \\ 6 \\ 7 \end{array} & \left[ \begin{array}{ccccccc} 0 & 0 & 1,2 & 3,4 & 5,6 & 17,18 & 19,20 \\ 0 & 0 & 7,8 & 9,10 & 11,12 & 21,22 & 23,24 \\ 1,2 & 7,8 & 0 & 0 & 13,14 & 25,26 & 27,28 \\ 3,4 & 9,10 & 0 & 0 & 15,16 & 29,30 & 31,32 \\ 5,6 & 11,12 & 13,14 & 15,16 & 0 & 0 & 0 \\ 17,18 & 21,22 & 25,26 & 29,30 & 0 & 0 & 0 \\ 19,20 & 23,24 & 27,28 & 31,32 & 0 & 0 & 0 \end{array} \right] \end{array}$$
2701   2702

FIG.28

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| 1 | 1 | 0 | 1 | 0 | 0 | 0 | 0 | 0 | 0 | 0 | 0 | 0 | 0 | 0 | 0 | 0 | 1 | 1 | 1 | 1 | 0 | 0 | 0 | 0 | 0 | 0 | 0 | 0 | 0 | 0 | 0 | 0 |
| 2 | 1 | 0 | 1 | 0 | 0 | 0 | 0 | 0 | 0 | 0 | 0 | 0 | 0 | 0 | 0 | 0 | 0 | 0 | 0 | 0 | 1 | 1 | 1 | 1 | 0 | 0 | 0 | 0 | 0 | 0 | 0 | 0 |
| 3 | 1 | 0 | 0 | 1 | 0 | 0 | 0 | 0 | 0 | 0 | 0 | 0 | 0 | 0 | 0 | 0 | 0 | 0 | 0 | 0 | 0 | 0 | 0 | 0 | 1 | 1 | 1 | 1 | 0 | 0 | 0 | 0 |
| 4 | 0 | 0 | 0 | 0 | 0 | 0 | 0 | 0 | 0 | 0 | 0 | 0 | 0 | 0 | 0 | 1 | 0 | 0 | 0 | 0 | 0 | 0 | 0 | 0 | 0 | 0 | 0 | 0 | 1 | 1 | 1 | 1 |
| 5 | 0 | 0 | 0 | 0 | 1 | 1 | 1 | 1 | 0 | 0 | 0 | 0 | 0 | 0 | 0 | 0 | 0 | 0 | 0 | 0 | 1 | 1 | 0 | 0 | 1 | 1 | 0 | 0 | 1 | 1 | 0 | 0 |
| 6 | 0 | 0 | 0 | 0 | 0 | 0 | 0 | 0 | 1 | 1 | 1 | 1 | 0 | 0 | 0 | 0 | 0 | 0 | 1 | 1 | 0 | 0 | 1 | 1 | 0 | 0 | 1 | 1 | 0 | 0 | 1 | 1 |
| 7 | 0 | 0 | 0 | 0 | 0 | 0 | 0 | 0 | 0 | 0 | 0 | 0 | 1 | 1 | 1 | 1 | 1 | 0 | 1 | 0 | 1 | 0 | 1 | 0 | 1 | 0 | 1 | 0 | 1 | 0 | 1 | 0 |

$$= \begin{bmatrix} 1 & 0 & 1 & 1 & 0 & 0 & 1 & 0 & 0 & 0 \\ 0 & 1 & 0 & 1 & 1 & 0 & 0 & 1 & 0 & 0 \\ 1 & 0 & 1 & 0 & 1 & 1 & 0 & 0 & 1 & 1 \\ 0 & 1 & 1 & 0 & 0 & 1 & 0 & 0 & 0 & 1 \end{bmatrix}$$

$$= \begin{bmatrix} 1 & 1 & 0 & 0 & 1 & 0 & 0 & 0 \\ 0 & 1 & 1 & 0 & 0 & 1 & 0 & 0 \\ 1 & 0 & 1 & 1 & 0 & 0 & 1 & 0 \\ 1 & 0 & 0 & 1 & 0 & 0 & 0 & 1 \end{bmatrix}$$

$$H = \begin{bmatrix} h1 & h2 & h3 & h4 & h5 & h6 & 0 & 0 & 0 & 0 & 0 & 0 & 0 & 0 & 0 & 0 & h7 & h8 & h9 & h10 & 0 & 0 & 0 & 0 & 0 & 0 & 0 & 0 & 0 & 0 \\ 0 & 0 & 0 & 0 & 0 & 0 & h1 & h2 & h3 & h4 & h5 & h6 & 0 & 0 & 0 & 0 & 0 & 0 & 0 & 0 & h7 & h8 & h9 & h10 & 0 & 0 & 0 & 0 & 0 & 0 \\ h1 & h2 & 0 & 0 & 0 & 0 & h3 & h4 & 0 & 0 & 0 & 0 & h5 & h6 & 0 & 0 & 0 & 0 & 0 & 0 & 0 & 0 & 0 & 0 & h7 & h8 & h9 & h10 & 0 & 0 \\ 0 & 0 & h1 & h2 & 0 & 0 & 0 & 0 & h3 & h4 & 0 & 0 & 0 & 0 & h5 & h6 & 0 & 0 & 0 & 0 & 0 & 0 & 0 & 0 & 0 & 0 & 0 & 0 & h7 & h8 & h9 & h10 \\ 0 & 0 & 0 & 0 & h'1 & h'2 & 0 & 0 & 0 & 0 & h'3 & h'4 & h'5 & h'6 & h'7 & h'8 & 0 & 0 & 0 & 0 & 0 & 0 & 0 & 0 & 0 & 0 & 0 & 0 & 0 & 0 \\ 0 & 0 & 0 & 0 & 0 & 0 & 0 & 0 & 0 & 0 & 0 & 0 & 0 & 0 & 0 & 0 & 0 & h'1 & h'2 & 0 & 0 & h'3 & h'4 & 0 & 0 & h'5 & h'6 & 0 & 0 & h'7 & h'8 & 0 & 0 \\ 0 & 0 & 0 & 0 & 0 & 0 & 0 & 0 & 0 & 0 & 0 & 0 & 0 & 0 & 0 & 0 & 0 & 0 & h'1 & h'2 & 0 & 0 & h'3 & h'4 & 0 & 0 & h'5 & h'6 & 0 & 0 & h'7 & h'8 \end{bmatrix}$$

[Matrix with regions labeled 3101, 3102, 3111, 3112 — binary matrix representation below]

FIG.36

$$\begin{array}{c} \phantom{1}\phantom{00}\phantom{00}\phantom{00}\phantom{00}\phantom{00}\phantom{00}\overbrace{\phantom{000}}^{3601}\phantom{00}\overbrace{\phantom{000}}^{3602} \\ \phantom{1}\;\;1\;\;\;2\;\;\;3\;\;\;\;4\;\;\;\;5\;\;\;6\;\;\;7\;\;\;8\;\;\;\;9\;\;10\;\;11\;\;12 \\ \begin{array}{r} 1 \\ 2 \\ 3 \\ 4 \\ 5 \\ 6 \\ 7 \\ 8 \\ 9 \\ 10 \\ 11 \\ 12 \end{array}\!\!\left[\begin{array}{cccccccccccc} 0 & 0 & 0 & 0 & 1 & 0 & 1 & 1 & 15 & 0 & 16 & 17 \\ 0 & 0 & 0 & 0 & 1 & 1 & 0 & 1 & 18 & 19 & 0 & 20 \\ 0 & 0 & 0 & 0 & 1 & 1 & 1 & 0 & 21 & 22 & 23 & 0 \\ 0 & 0 & 0 & 0 & 1 & 1 & 1 & 1 & 0 & 24 & 25 & 26 \\ 1 & 4 & 7 & 10 & 0 & 0 & 0 & 0 & 27 & 0 & 28 & 29 \\ 0 & 5 & 8 & 11 & 0 & 0 & 0 & 0 & 30 & 31 & 0 & 32 \\ 2 & 0 & 9 & 12 & 0 & 0 & 0 & 0 & 33 & 34 & 35 & 0 \\ 3 & 6 & 0 & 13 & 0 & 0 & 0 & 0 & 14 & 36 & 37 & 38 \\ 15 & 18 & 21 & 0 & 27 & 30 & 33 & 14 & 0 & 0 & 0 & 0 \\ 0 & 19 & 22 & 24 & 0 & 31 & 34 & 36 & 0 & 0 & 0 & 0 \\ 16 & 0 & 23 & 25 & 28 & 0 & 35 & 37 & 0 & 0 & 0 & 0 \\ 17 & 20 & 0 & 26 & 29 & 32 & 0 & 38 & 0 & 0 & 0 & 0 \end{array}\right] \end{array}$$

$$H = \begin{bmatrix} \text{3801} & & & & \text{3802} \\ \text{(matrix entries)} & & & & \end{bmatrix}$$

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2017-180631, filed on Sep. 20, 2017; the entire contents of all of which are incorporated herein by reference.

FIELD

Embodiments described herein relate generally to a memory system and a method of controlling a nonvolatile memory.

BACKGROUND

When data is encoded to have redundancy, an error correcting code enables the correction of errors having occurred in the data. As such an error correcting code, an iterated code exists. In these years, a graph code that is a code system higher in correcting capability is also proposed.

The graph code is a code whose component codes are formed of combinations based on a graph theory. When information words are encoded using a generator matrix as the encoding method of the graph code, the size of the generator matrix is large. Thus, the scale of a data-saving circuit to store data necessary for encoding and the size of memory for encoding may be large.

BRIEF DESCRIPTION OF THE DRAWINGS

FIG. 3 is a flow chart schematically illustrating an example operation of a graph incidence matrix generator according to the first embodiment;

FIG. 4 is a diagram illustrating the graph structure of a graph in the first embodiment;

FIG. 5 is a diagram illustrating an example adjacency matrix of the graph shown in FIG. 4;

FIG. 6 is a diagram illustrating an example for explaining the classification of edges according to the first embodiment;

FIG. 7 is a diagram illustrating another example for explaining the classification of edges according to the first embodiment;

FIG. 8 is a diagram illustrating an example adjacency matrix having edges classified according to the first embodiment;

FIG. 9 is a diagram illustrating an example for explaining the numbering of edges according to the first embodiment;

FIG. 10 is a diagram illustrating another example for explaining the numbering of edges according to the first embodiment;

FIG. 11 is a diagram illustrating an example generated adjacency matrix in the first embodiment;

FIG. 12 is a diagram illustrating an example incidence matrix of the graph according to the first embodiment;

FIG. 13 is a diagram illustrating an example check matrix of a component code for vertices 1 to 6 of the graph according to the first embodiment;

FIG. 14 is a diagram illustrating an example check matrix of a component code for vertices 7 to 10 of the graph according to the first embodiment;

FIG. 15 is a diagram illustrating an example check matrix of a graph code according to the first embodiment;

FIG. 22 is a diagram illustrating an example check matrix of a graph code according to the second embodiment;

FIG. 25 is a diagram illustrating an example for explaining the numbering of edges according to the third embodiment;

FIG. 26 is a diagram illustrating another example for explaining the numbering of edges according to the third embodiment;

FIG. 27 is a diagram illustrating an example generated adjacency matrix in the third embodiment;

FIG. 28 is a diagram illustrating an example incidence matrix of the graph according to the third embodiment;

FIG. 29 is a diagram illustrating an example check matrix of a component code for vertices 1 to 4 of the graph according to the third embodiment;

FIG. 30 is a diagram illustrating an example check matrix of a component code for vertices 5 to 7 of the graph according to the third embodiment;

FIG. 31 is a diagram illustrating an example check matrix of a graph code according to the third embodiment;

FIG. 36 is a diagram illustrating an example generated adjacency matrix in the fourth embodiment;

FIG. 37 is a diagram illustrating an example incidence matrix of the graph according to the fourth embodiment; and FIG. 38 is a diagram illustrating an example check matrix of a graph code according to the fourth embodiment.

DETAILED DESCRIPTION

According to one embodiment, a memory system and a data writing method are provided which system can be connected to a host and which comprises a nonvolatile memory; an encoder that encodes at least a part of user data received from the host as an information word by a graph code; an encode data holding unit that holds for-encoding data to be used when the encoder encodes the information word; and a memory interface that writes a code word subjected to the encoding into the nonvolatile memory. A check matrix of the graph code includes first to sixth submatrices. The encoder produces a first vector obtained by multiplying the information word and the first submatrix, produces a second vector obtained by multiplying the information word and the third submatrix, produces a third vector obtained by multiplying the first vector and the fifth submatrix inverted in sign, produces a fourth vector obtained by adding the third vector and the second vector, produces a first parity obtained by multiplying the fourth vector and the for-encoding data, produces a fifth vector obtained by multiplying the first parity and the second submatrix inverted in sign, and produces a second parity obtained by adding the fifth vector and the first vector. The memory interface writes the information word, the first parity, and the second parity as the code word into the nonvolatile memory.

Memory systems and methods of controlling a nonvolatile memory according to embodiments will be described in detail below with reference to the accompanying drawings. The present invention is not limited to the following embodiments.

(First Embodiment)

Figure 1:
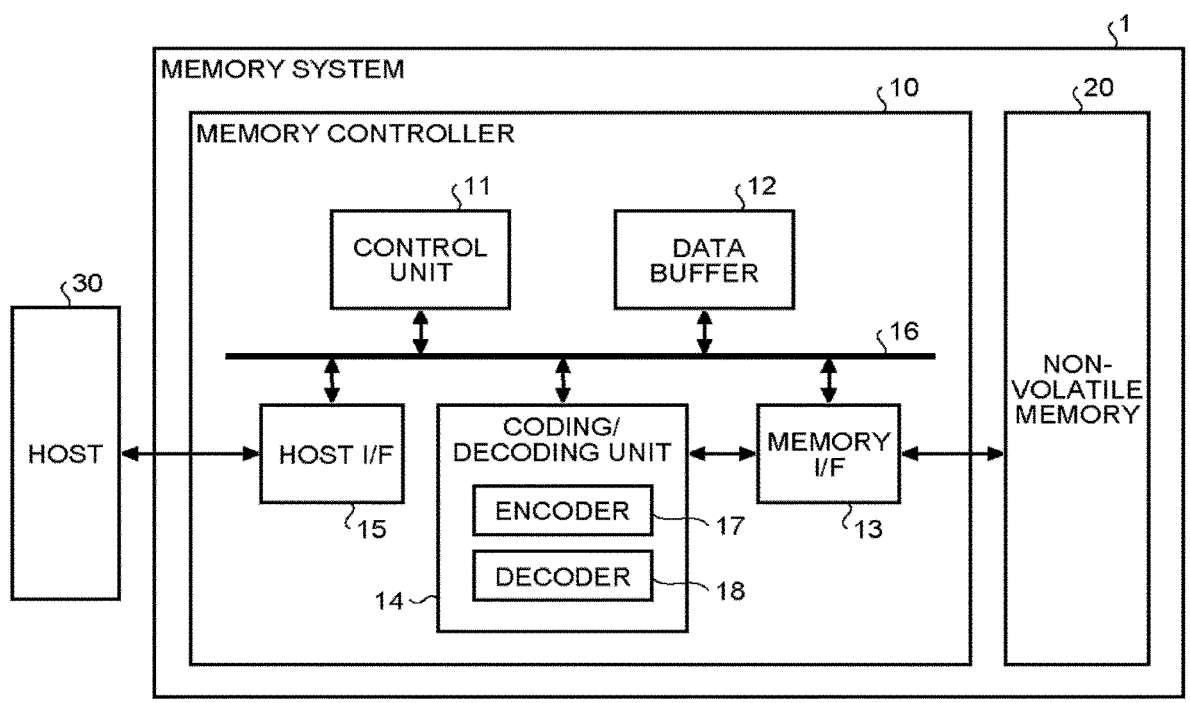
FIG. 1 is a block diagram schematically illustrating an example configuration of a memory system according to a first embodiment.

First, a memory system and a method of controlling a nonvolatile memory according to a first embodiment will be described in detail with reference to the drawings. FIG. 1 is a block diagram schematically illustrating an example configuration of the memory system according to the first embodiment. As illustrated in FIG. 1, the memory system 1 comprises a memory controller 10 and a nonvolatile memory 20. The memory system 1 can be connected to a host 30, and FIG. 1 shows the state of being connected to the host 30. The host 30 may be an electronic device such as a personal computer, a mobile terminal, or the like.

The nonvolatile memory 20 stores data in a nonvolatile manner and is, for example, a NAND flash memory (hereinafter simply called a NAND memory). Although the description below illustrates the case where a NAND memory is used as the nonvolatile memory 20, a storage device other than a NAND memory, such as a three dimensionally structured flash memory, a Resistance Random Access Memory (ReRAM), or a Ferroelectric Random Access Memory (FeRAM), can also be used as the nonvolatile memory 20. Further, it is not essential that the nonvolatile memory 20 is a semiconductor memory, but the present embodiment can also be applied to various storage media other than a semiconductor memory.

The memory system 1 may be one of various memory systems including the nonvolatile memory 20 such as a so-called Solid State Drive (SSD) and a memory card that contains the memory controller 10 and the nonvolatile memory 20 in one package.

The memory controller 10 controls writing into the nonvolatile memory 20 according to a write request from the host 30 and controls reading from the nonvolatile memory 20 according to a read request from the host 30. The memory controller 10 comprises a host interface (I/F) 15, a memory interface (I/F) 13, a control unit 11, a coding/decoding unit (codec) 14, and a data buffer 12. The host I/F 15, the memory I/F 13, the control unit 11, the coding/decoding unit 14, and the data buffer 12 are connected to each other by an internal bus 16.

The host I/F 15 performs processing compliant with the standard of the interface with the host 30 to output an instruction, user data to be written, or the like received from the host 30 onto the internal bus 16. Further, the host I/F 15 transmits user data read from the nonvolatile memory 20 and reconstructed, a response from the control unit 11, or the like to the host 30.

The memory I/F 13 performs processing of writing into the nonvolatile memory 20 according to an instruction from the control unit 11. Further, the memory I/F 13 performs processing of reading from the nonvolatile memory 20 according to an instruction from the control unit 11.

The data buffer 12 temporarily stores user data received from the host 30 until the memory controller 10 stores the user data into the nonvolatile memory 20. Or the data buffer 12 temporarily stores user data read from the nonvolatile memory 20 and reconstructed until the user data is transmitted to the host 30. A general-purpose memory such as a Static Random Access Memory (SRAM) or a Dynamic Random Access Memory (DRAM) can be used as the data buffer 12.

The coding/decoding unit 14 encodes user data temporarily stored in the data buffer 12 to create code words to be written into the nonvolatile memory 20. The coding/decoding unit 14 decodes received words read from the nonvolatile memory 20 to reconstruct user data. The coding/decoding unit 14 comprises an encoder 17 and a decoder 18. Note that data encoded by the coding/decoding unit 14 may include control data and the like used in the memory controller 10 as well as user data.

The control unit 11 controls the constituents of the memory system 1 overall. When receiving an instruction from the host 30 via the host I/F 15, the control unit 11 performs control according to the instruction. For example, the control unit 11, according to a write request from the host 30, instructs the memory I/F 13 to write user data received together with the write request from the host 30 and stored in the data buffer 12 into the nonvolatile memory 20. Further, the control unit 11 instructs the memory I/F 13 to read user data from the nonvolatile memory 20 according to a read request from the host 30.

When receiving a write request from the host 30, the control unit 11 determines a storage area (memory area) in the nonvolatile memory 20 for user data received together with the write request from the host 30 and stored in the data buffer 12. That is, the control unit 11 manages write destinations for user data. The correspondence between the logical address of user data received from the host 30 and the physical address referring to the storage area in the nonvolatile memory 20 where that user data is stored, is stored as part of an address conversion table.

When receiving a read request from the host 30, the control unit 11 converts the logical address specified by the read request into a physical address using the address conversion table and instructs the memory I/F 13 to read data at the physical address.

In NAND memories, generally writing and reading are performed in data units called pages, and erasing is performed in data units called blocks. In the present embodiment, a memory cell group refers to a plurality of memory cells connected to the same word line. In the case where the memory cells are single-level cells (SLCs), one memory cell group corresponds to one page. In the case where the memory cells are multi-level cells (MLCs), one memory cell group corresponds to a plurality of pages. Each memory cell is connected to a word line and also connected to a bit line.

Thus, each memory cell can be identified by the address to identify the word line and the address to identify the bit line.

Next, write processing in the present embodiment will be described. The control unit 11 instructs the encoder 17 to encode user data in writing into the nonvolatile memory 20. At this time, the control unit 11 determines a storage area (storage address) for code words in the nonvolatile memory 20 and notifies the determined storage area to the memory I/F 13.

The encoder 17 encodes user data in the data buffer 12 according to the instruction from the control unit 11 to create code words. As the encoding method, one which uses an algebraic code such as a Bose-Chaudhuri-Hocquenghem (BCH) code as described later or one which uses a code based on a sparse graph such as a Low-Density Parity-Check (LDPC) code can be adopted. The memory I/F 13 performs control to store code words into the storage area in the nonvolatile memory 20 notified by the control unit 11.

Next, the processing in reading from the nonvolatile memory 20 of the present embodiment will be described. The control unit 11, specifying an address in the nonvolatile memory 20, instructs the memory I/F 13 to read in reading from the nonvolatile memory 20. Further, the control unit 11 instructs the decoder 18 to start decoding. The memory I/F 13, according to the instruction from the control unit 11, reads received words at the specified address in the nonvolatile memory 20 and inputs the read received words to the decoder 18. The decoder 18 decodes the received words read from the nonvolatile memory 20.

Next, the configuration and its operation of creating for-encoding data that is used by the encoder 17 in encoding in the present embodiment will be described in detail with reference to a drawing.

Figure 2:
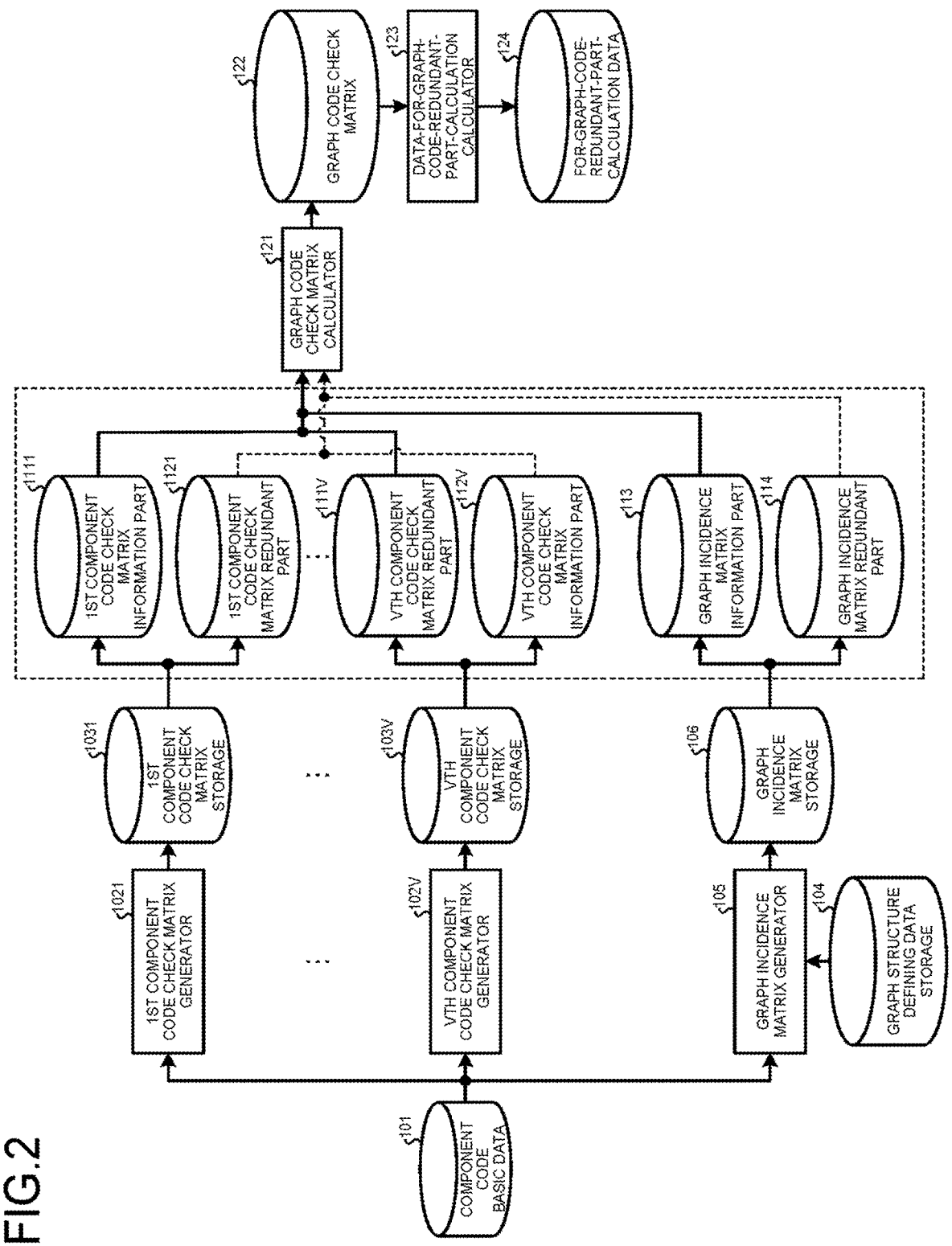
FIG. 2 is a block diagram schematically illustrating an example configuration of a data-for-encoding creating unit according to the first embodiment.

FIG. 2 is a block diagram schematically illustrating an example configuration of a data-for-encoding creating unit according to the present embodiment. In the description below, assume that a non-directed graph (hereinafter simply called a graph) G having the number V of vertices (V is an integer of one or greater) is given. In this case, the number of component codes of the graph code is V. In the present description, there may be a plurality of edges between two vertices of the graph.

As illustrated in FIG. 2, the data-for-encoding creating unit 100 comprises 1st to Vth component code check matrix generators 1021 to 102V, 1st to Vth component code check matrix storages 1031 to 103V, a graph structure defining data storage 104, a graph incidence matrix generator 105, a graph incidence matrix storage 106, a graph code check matrix calculator 121, and a data-for-graph-code-redundant-part-calculation calculator 123. In the description below, the 1st to Vth component code check matrix generators 1021 to 102V are called a component code check matrix generator 102 when not distinguished. Likewise, the 1st to Vth component code check matrix storages 1031 to 103V are called a component code check matrix storage 103 when not distinguished.

In the configuration shown in FIG. 2, the 1st to Vth component code check matrix generators 1021 to 102V and the 1st to Vth component code check matrix storages 1031 to 103V are respectively provided for the vertices of the graph G. The component code check matrix generator 102 has inputted thereto component code basic data 101 defining the code length, information length, and the like of each component code and generates the check matrix of the component code (hereinafter called a component code check matrix) at each vertex based on the inputted component code basic data 101 to output. Each component code check matrix storage 103 stores the component code check matrix outputted from the component code check matrix generator 102 corresponding thereto.

In the present embodiment, each component code check matrix is a systematic code type H=(P I), where I is an identity matrix, and can be divided into a submatrix P corresponding to an information part (corresponding to the 1st to Vth component code check matrix information part 1111 to 111V in FIG. 2) and a submatrix I corresponding to a redundant part (corresponding to the 1st to Vth component code check matrix redundant part 1121 to 112V in FIG. 2). In the description below, the 1st to Vth component code check matrix information parts 1111 to 111V are called a component code check matrix information part 111 when not distinguished. Likewise, the 1st to Vth component code check matrix redundant parts 1121 to 112V are called a component code check matrix redundant part 112 when not distinguished.

The graph structure defining data storage 104 stores data for defining the structure of the graph G (graph structure defining data) such as an adjacency matrix of the graph G. The graph incidence matrix generator 105 has inputted thereto the check matrix of each component code or the length of the information part and the length of the redundant part of each component code and uses the graph structure defining data inputted from the graph structure defining data storage 104 for this inputted information, thereby generating such an incidence matrix of the graph G (hereinafter called a graph incidence matrix) as to minimize the length of the redundant part in the graph code to output. The graph incidence matrix storage 106 stores the graph incidence matrix outputted by the graph incidence matrix generator 105.

In the present embodiment, the graph incidence matrix can be divided into a submatrix corresponding to the information part (corresponding to a graph incidence matrix information part 113 in FIG. 2) and a submatrix corresponding to the redundant part (corresponding to a graph incidence matrix redundant part 114 in FIG. 2) as described later.

The graph code check matrix calculator 121 has inputted thereto the component code check matrix at each vertex and the graph incidence matrix and calculates a check matrix 122 of the graph code (hereinafter called a graph code check matrix) to output. In calculation in the graph code check matrix calculator 121, for each component code check matrix, the component code check matrix information part 111 acts on the graph incidence matrix information part 113 while the component code check matrix redundant part 112 acts on the graph incidence matrix redundant part 114. Thereby, the graph code check matrix 122 is calculated and outputted.

The data-for-graph-code-redundant-part-calculation calculator 123 has inputted thereto the graph code check matrix 122 and outputs for-graph-code-redundant-part-calculation data (for-encoding data) 124. In this case, in the graph incidence matrix generator 105, by implementing a clever way to number edges joining the vertices of the graph G (hereinafter simply called edge numbering), the graph code check matrix 122 can be made to be in a form that can be used in encoding by a Richardson-Urbanke (RU) method. As a result, the for-graph-code-redundant-part-calculation data (for-encoding data) 124 can be minimized as described later.

Next, the operation of the graph incidence matrix generator 105 in FIG. 2 will be described in detail with reference to a drawing. FIG. 3 is a flow chart schematically illustrating an example operation of the graph incidence matrix generator according to the present embodiment. As illustrated in FIG. 3, in this operation, first the graph incidence matrix generator 105 generates an adjacency matrix of the graph G (hereinafter called a graph adjacency matrix) (step S101). Then the graph incidence matrix generator 105 numbers edges joining the vertices of the graph G divided into the information part and redundant part (step S102). Then the graph incidence matrix generator 105 generates a graph incidence matrix based on the generated graph adjacency matrix and the numbers of the edges (step S103) and finishes the present operation.

Next, the details of the steps in the flow chart shown in FIG. 3 will be described in detail with reference to drawings.

First, the operation (of generating a graph adjacency matrix) in step S101 of FIG. 3 will be described. Letting $A_G$ be an adjacency matrix expressing the graph G having the number V of vertices, the adjacency matrix $A_G$ is a V×V matrix. Both the rows and columns of the adjacency matrix $A_G$ respectively correspond to the vertices of the graph G. If there are edges between each two vertices, the number of the edges is stored in the rows and columns of the adjacency matrix $A_G$, and if there is no edge, a zero is stored. Note that in the present embodiment the adjacency matrix $A_G$ is a symmetric matrix whose diagonal components are zero.

Considering the graph G shown in, e.g., FIG. 4, its adjacency matrix $A_G$ is expressed by the matrix shown in FIG. 5. Here, numerals inside open circles in FIG. 4 denote respective vertex numbers. The assigned numerals outside the adjacency matrix $A_G$ in FIG. 5 denote the numbers of the vertices to which the rows or the columns correspond respectively. The graph G shown in FIG. 4 is a complete tripartite graph. Here, the complete M-partite graph refers to a graph where, the vertices of the graph being divided into M subsets (M is an integer of two or greater), there are no edges between the vertices of each subset whereas there is certainly an edge between respective vertices of different subsets.

Next, the operation (of numbering the edges of the graph) in step S102 of FIG. 3 will be described. The operation in step S102 of FIG. 3 is important in minimizing the for-graph-code-redundant-part-calculation data (for-encoding data) 124. In numbering the edges of the graph, the operation of numbering all edges connecting to a vertex is performed for all the vertices. This corresponds to replacing nonzero elements of the adjacency matrix $A_G$ with edge numbers. Note that, since the adjacency matrix $A_G$ is a symmetric matrix, numbering for the upper triangular part suffices. In the present invention, by classifying the edges connecting to the vertices into an edge set corresponding to the information part and an edge set corresponding to the redundant part and numbering edges separately for each set, a finally obtained check matrix is shaped in a desired form, thereby reducing the for-graph-code-redundant-part-calculation data (for-encoding data) 124. The specific algorithm (algorithm for numbering edges using the adjacency matrix) will be described next.

In executing the algorithm for numbering edges using the adjacency matrix, the following three conditions are assumed. First, consider only the upper triangular part of the adjacency matrix. Second, let n(j) be the sum of the values of nonzero elements at each vertex j and p(j) be the redundant-part length of the component code. Third, let E(i) be an edge set corresponding to an information part and E(r) be an edge set corresponding to a redundant part.

In executing the algorithm for numbering edges using the adjacency matrix, first, the edges are classified, and, second, numbered.

In classifying the edges, the values of the nonzero elements in the jth row (j is an integer of one or greater) are added in the order of from the smallest column number, and the edges are classified according to whether the sum exceeds (n(j)-p(j)). That is, classification is performed such that nonzero elements are included in E(i) until the sum becomes less than or equal to (n(j)-p(j)) and that the other nonzero elements are included in E(r). This operation is performed for j=1, 2, . . . , V. At this time, if there is a row for which the sum does not exceed (n(j)-p(j)), all the nonzero elements of the row are included in E(i).

In numbering edges, let N(E(i)) be the number of elements included in the edge set E(i) obtained as a result of the above operation, S(E(i)) be the sum of the elements, N(E(r)) be the number of elements included in the edge set E(r), and S(E(r)) be the sum of the elements. In numbering edges included in the edge set E(i), numbers of 1 to S(E(i)) are assigned to all the elements with no omission and no duplication. At this time, letting k be the value of an element, k consecutive numbers are assigned to the element (that is, one number is assigned to one edge). In numbering edges included in the edge set E(r), numbers of S(E(i))+1, S(E(i))+2, . . . , S(E(i))+S(E(r)) are respectively assigned to them in the order in which the edges were included in the E(r). Also here, when the value of an element is k, k consecutive numbers are assigned to the element.

The above algorithm will be described taking numbering edges of the graph G shown in FIG. 4 as an example. In this example, let the redundant-part length of the component code at each vertex be three. In the case of the graph G, the classification of edges connecting to the first vertex is shown as in FIG. 6. Here, suppose that dotted-line edges are included in an information-part edge set and that dot-dashed line edges are included in a redundant-part edge set. Likewise, the classification of edges connecting to the second vertex is shown as in FIG. 7. By repeating the same procedure for all the remaining vertices, all the edges included in the upper triangular part of the adjacency matrix $A_G$ can be classified as shown in FIG. 8. In this figure, the part 801 surrounded by the dotted-line frame denotes the information-part edge set, and the part 802 surrounded by the dot-dashed line frame denotes the redundant-part edge set.

Next, edges are numbered using the classification. The edges included in the information-part edge set are numbered incrementally in the order in which the edges were included in this set. Noting that the number of the edges included in the information-part edge set is 15, the numbering of the edges connecting to the first vertex is shown as in FIG. 9. Likewise, the numbering of the edges connecting to the second vertex is shown as in FIG. 10. By repeating the same procedure for all the remaining vertices, all the edges can be numbered. When this is executed by replacing elements of the adjacency matrix $A_G$, the finally obtained matrix is shown as in FIG. 11. As shown in FIG. 11, the numbers of the edges included in the redundant-part edge set of the part 1102 are greater than that of any edge included in the information-part edge set of the part 1101.

Next, the operation (of generating a graph incidence matrix) in step S103 of FIG. 3 will be described. Letting $B_G$ be an incidence matrix representing the graph G having the number V of vertices and the number E of edges, $B_G$ is a V×E matrix. Each row of the incidence matrix $B_G$ corresponds to a vertex, and each column corresponds to an edge.

If a vertex is connected to an edge, 1 is stored in the rows and columns of the incidence matrix $B_G$, and if not connected, 0 is stored.

When an edge number matrix as shown in, e.g., FIG. 11 is obtained, 1 is stored in columns of the incidence matrix $B_G$ respectively corresponding to the values of nonzero elements in each row of the edge number matrix, and 0 is stored in the other columns, thereby finally obtaining the incidence matrix $B_G$. Thus, the incidence matrix of the graph G shown in FIG. 4 is shown as in FIG. 12. In this figure, the part 1201 surrounded by the dotted-line frame denotes the part corresponding to the information-part edge set, and the part 1202 surrounded by the dot-dashed line frame denotes the part corresponding to the redundant-part edge set. Note that an assigned numeral outside the matrix denotes, for a row, the number of the vertex to which the row corresponds and, for a column, the number of the edge to which the column corresponds.

Next, the operation of obtaining a check matrix of a graph code by the graph code check matrix calculator 121 in the data-for-encoding creating unit 100 shown in FIG. 2 will be described. The check matrix of the graph code is formed of the check matrix of the component code defined at each vertex of the graph G and the incidence matrix of the graph G. A specific algorithm for generating a check matrix of a graph code (a graph-code check-matrix generating algorithm) is as follows. In executing this algorithm, the following three conditions are assumed. First, suppose that the incidence matrix of the graph G is obtained by the above operation. Second, let n(j) be the number of 1s in the jth row of the incidence matrix, and let the 1s be labeled k=1, 2, . . . , n(j) starting from the beginning. Third, suppose that the check matrix of the component code at each vertex of the graph G is of a systematic code type (its back part is an identity matrix).

In the graph-code check-matrix generating algorithm, the kth element of 1 in the jth row of the incidence matrix is replaced with the kth column vector of the check matrix of the component code, and an element of 0 is replaced with the zero column vector. The foregoing operation is performed for j=1, 2, . . . , V.

Figure 15:
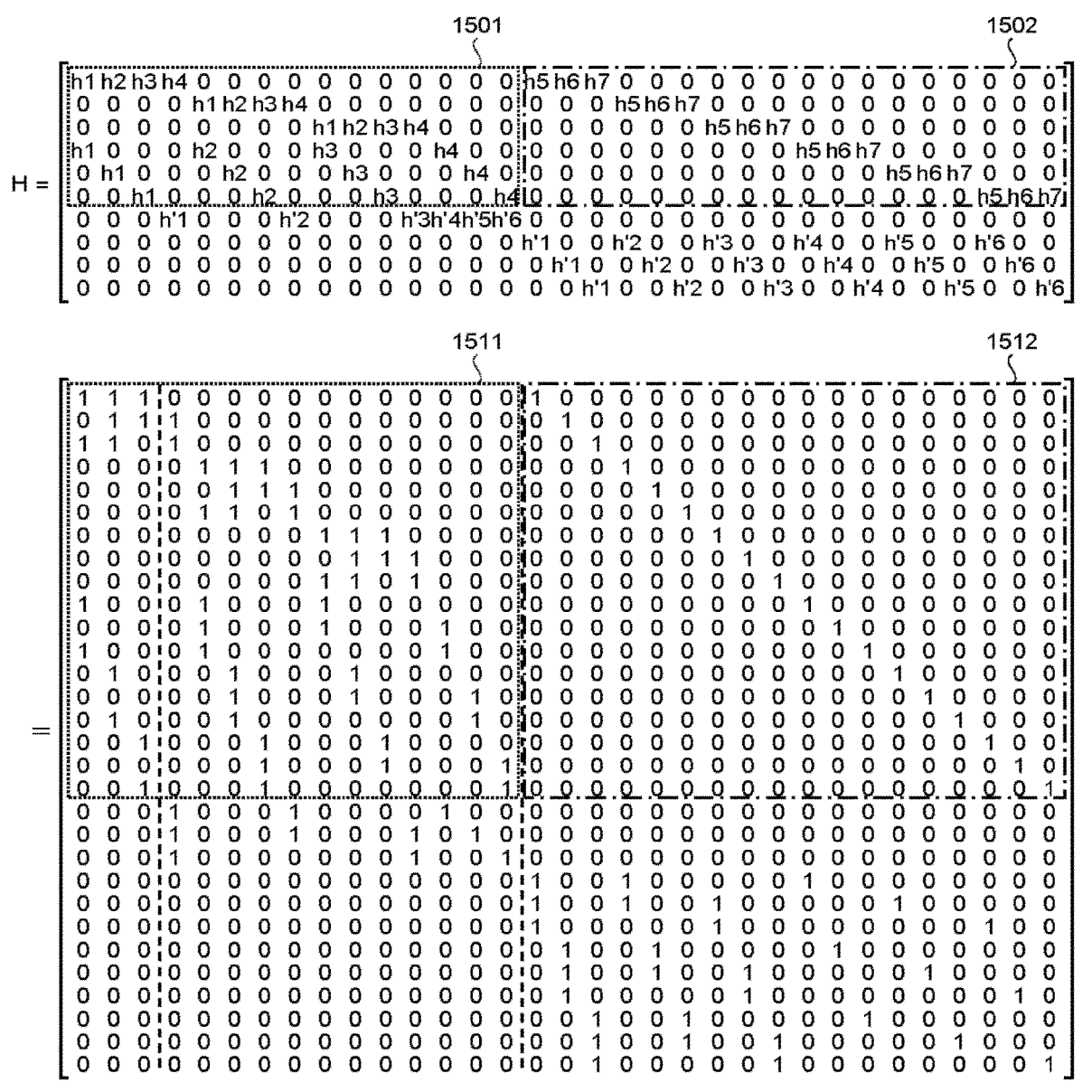

For example, the case of forming the check matrix of the graph code determined by the graph G shown in FIG. 4 will be described. The incidence matrix of the graph G is shown as in FIG. 12, as mentioned above. Assume that the check matrix of the component code at each vertex of the graph G is given by the equation shown in FIG. 13 for vertices 1 to 6 and given by the equation shown in FIG. 14 for vertices 7 to 10. Here, in FIGS. 13 and 14, the parts 1301 and 1401 surrounded by the dotted-line frames denote the information part, and the parts 1302 and 1402 surrounded by the dot-dashed line frames denote the redundant part. In this case, the check matrix H of the graph code is given as in FIG. 15. As shown in FIG. 15, the part 1501 corresponding to the information part of the incidence matrix surrounded by the dotted-line frame is replaced with the information part 1511 of the component code check matrix. The part 1502 corresponding to the redundant part surrounded by the dot-dashed line frame is replaced with the redundant part 1512 of the component code check matrix. This corresponds to the information part of the component code check matrix acting on the information part of the graph incidence matrix and the redundant part of the component code check matrix acting on the redundant part of the graph incidence matrix in the data-for-encoding creating unit 100 shown in FIG. 2.

Although description has been made taking as an example the case where the symbols of the code are binary, the symbols may be multiary.

On the basis of the above description, when the graph-code check-matrix generating algorithm is executed, the check matrix H of the graph code is expressed by the following equation (1).

$$H = \begin{pmatrix} A & B & I \\ C & D & E \end{pmatrix} \quad (1)$$

In the equation (1), I is an identity matrix. The submatrices A, B, C, D, E, and I are also called first to sixth submatrices. Here, if the redundant part length of the component code does not match the number of edges of the graph G, by appropriately performing a column permutation, the check matrix H can be shaped in the form of the equation (1). If H does not have full rank, a matrix formed of the lower submatrices C, D, E of the H from which linearly dependent rows are removed, is redefined as the check matrix H of the graph code. Letting N be the code length of the graph code and K be the information length, A is a (N−K−g)×K matrix; B is a (N−K−g)×g matrix; C is a g×K matrix; D is a g×g matrix; and E is a g×(N−K−g) matrix, where g<N−K and as the identity matrix part becomes larger, g becomes smaller.

The operation for obtaining the graph incidence matrix shown in step S103 of FIG. 3 is an algorithm for maximizing the identity matrix part and minimizing g. Thus, code words of the code defined from the check matrix H expressed by the equation (1) can be obtained by an RU method described below. Letting the code word be denoted as $c=(i, p_1, p_2)$, the code word c satisfies the following check equations (2) and (3) because $Hc^t = 0^t$.

$$p_1^t = -\phi^{-1}(-EA+C)i^t \quad (2)$$

$$p_2^t = -Ai^t - Bp_1^t \quad (3)$$

Here, $\phi = -EB+D$, and $\phi^{-1}$ is the inverse matrix of $\phi$. If the matrix $\phi$ is not regular, by appropriately performing a column permutation on the check matrix of the graph code, $\phi^{-1}$, which is the for-graph-code-redundant-part-calculation data (for-encoding data) 124, can be obtained. Specifically, the matrix $\phi$ can be made regular by the following method. First, the lower matrix (C D E) of the matrix H expressed by the equation (1) is converted to the form of (C' D' O) by a row elementary transformation. Note that the row vectors of this matrix are linearly independent. Next, by performing a row elementary transformation and a column permutation on (C' D' O), (C' D' O) is converted to the form of (C" I O). By performing an operation that is the row elementary transformation and column permutation extended over the matrix H, the matrix $\phi$ obtained from the matrix obtained by this operation is regular.

The $\phi^{-1}$ generated in the above way, which is the for-graph-code-redundant-part-calculation data (for-encoding data) 124, is held in the data buffer 12 in the memory system 1 or a memory in the coding/decoding unit 14 (also called an encode data holding unit) or the like and is used in encoding by the encoder 17 in the coding/decoding unit 14. The encoding by the encoder 17 according to the present embodiment will be described in detail below with reference to drawings.

Figure 16:
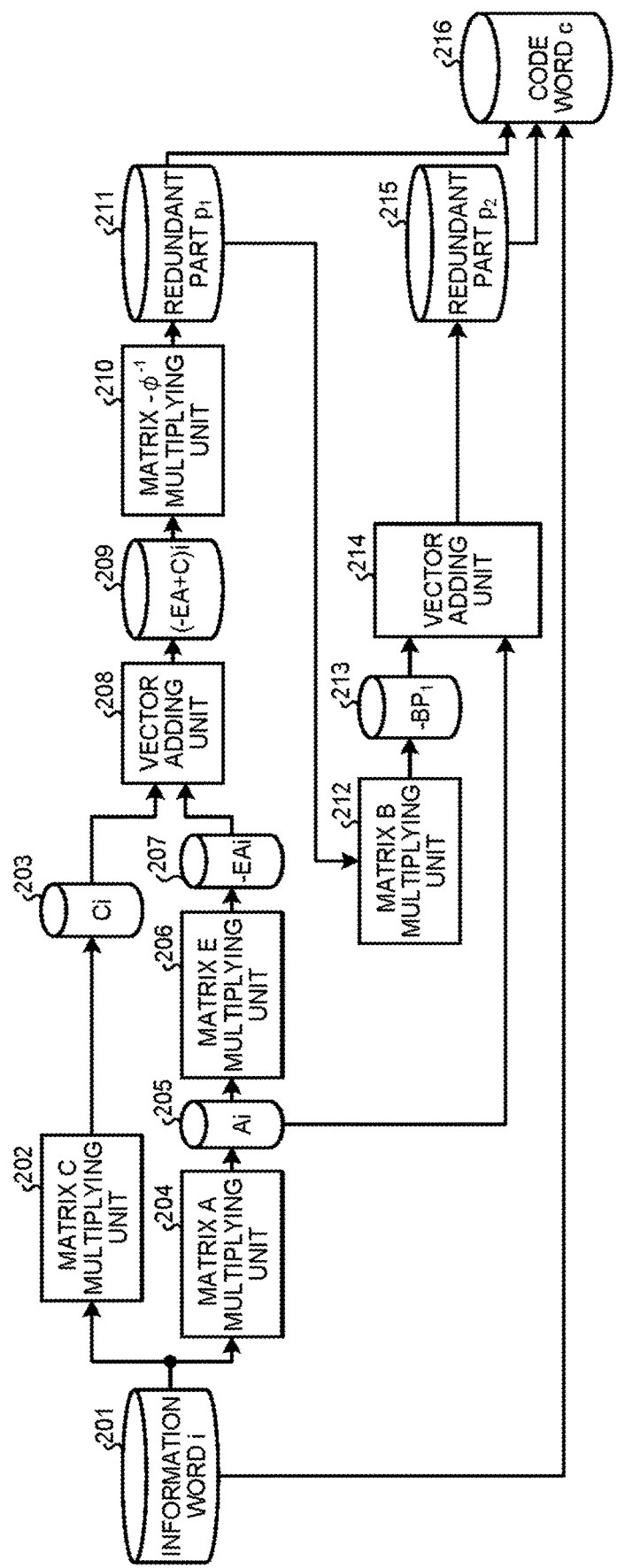
FIG. 16 is a block diagram schematically illustrating an example configuration of an encoder according to the first embodiment.

FIG. 16 is a block diagram schematically illustrating an example configuration of the encoder according to the present embodiment. As shown in FIG. 16, the encoder 17 comprises a matrix C multiplying unit 202, a matrix A multiplying unit 204, a matrix –E multiplying unit 206, a matrix $-\phi^{-1}$ multiplying unit 210, a matrix –B multiplying unit 212, and vector adding units 208 and 214.

Figure 17:
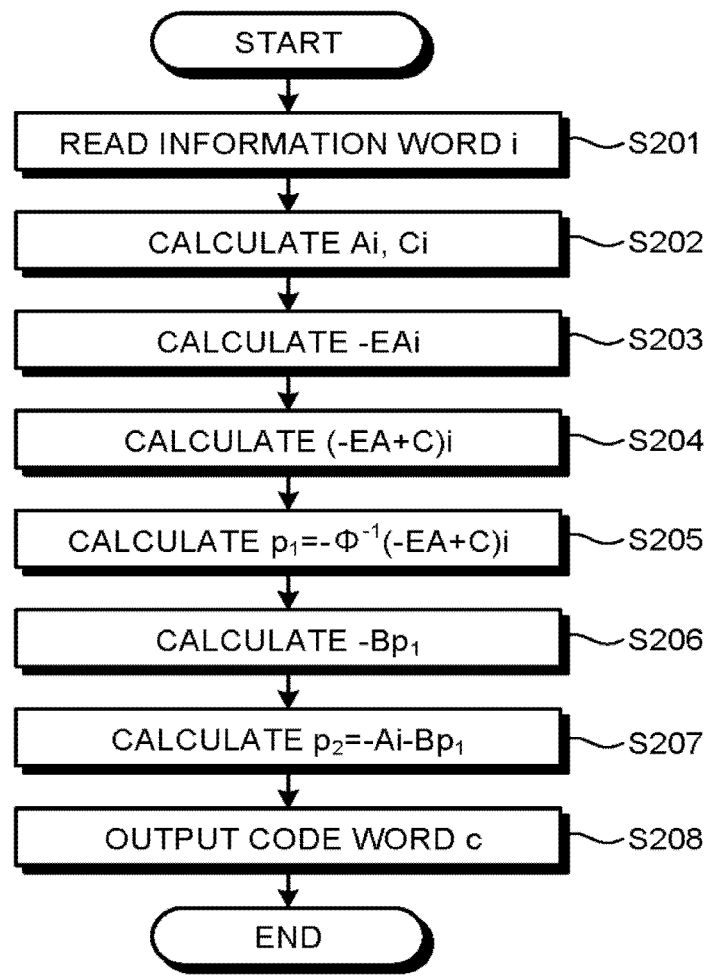
FIG. 17 is a flow chart illustrating an example encoding operation performed by the encoder according to the first embodiment.

Next, the encoding operation of the encoder 17 shown in FIG. 16 will be described using a flow chart shown in FIG. 17. FIG. 17 is a flow chart illustrating an example encoding operation performed by the encoder according to the present embodiment.

As illustrated in FIG. 17, first, the encoder 17 reads an information word (i) 201 (step S201). The information word (i) is, for example, part or all of user data specified in a write request from the host 30. The read information word (i) 201 is inputted to the matrix C multiplying unit 202 and matrix A multiplying unit 204. In response to this, the matrix C multiplying unit 202 multiplies the inputted information word (i) 201 by the submatrix C, thereby calculating a submatrix (Ci) 203, and the matrix A multiplying unit 204 multiplies the inputted information word (i) 201 by the submatrix A, thereby calculating a submatrix (Ai) 205 (step S202). The submatrix (Ai) 205 calculated by the matrix A multiplying unit 204 is inputted to the matrix –E multiplying unit 206. The matrix –E multiplying unit 206 multiplies the inputted submatrix (Ai) 205 by the submatrix –E, thereby calculating a submatrix (–EAi) 207 (step S203).

The submatrix (Ci) 203 calculated by the matrix C multiplying unit 202 and the submatrix (–EAi) 207 calculated by the matrix –E multiplying unit 206 in the above way are inputted to the vector adding unit 208. The vector adding unit 208 adds the submatrix (Ci) 203 and the submatrix (–EAi) 207, thereby calculating a submatrix ((–EA+C)i) 209 (step S204). The submatrix ((–EA+C)i) 209 calculated by the vector adding unit 208 is inputted to the matrix $-\phi^{-1}$ multiplying unit 210. The matrix $-\phi^{-1}$ multiplying unit 210 performs an operation corresponding to the above equation (2) on the inputted submatrix ((–EA+C)i) 209, thereby calculating a redundant part ($p_1$) 211 (step S205).

The redundant part ($p_1$) 211 calculated by the matrix $-\phi^{-1}$ multiplying unit 210 is inputted to the matrix –B multiplying unit 212. The matrix –B multiplying unit 212 multiplies the inputted redundant part ($p_1$) 211 by the submatrix –B, thereby calculating a submatrix (–B$p_1$) 213 (step S206). The submatrix (–B$p_1$) 213 calculated by the matrix –B multiplying unit 212 is inputted to the vector adding unit 214. The submatrix (Ai) 205 calculated by the matrix A multiplying unit 204 at step S202 is also inputted to the vector adding unit 214. The vector adding unit 214 performs an operation corresponding to the equation (3) using the inputted submatrix (–B$p_1$) 213 and submatrix (Ai) 205, thereby calculating a redundant part ($p_2$) 215 (step S207).

When calculating the redundant part ($p_1$) 211 and ($p_2$) 215 in this way, the encoder 17 concatenates the information word (i) 201 inputted at step S201 and the redundant parts ($p_1$) 211 and ($p_2$) 215, thereby generating a code word (c) 216 to output the generated code word (c) 216 (step S208) and finishes this operation.

In the operation shown in FIG. 17, the submatrices A, B, C, D, and E are formed from the incidence matrix of the graph G and the check matrix of the component code at each vertex. Thus, the encoder 17 does not need to hold these submatrices as for-encoding data. That is, the encoder 17 need only hold the $+\phi^{-1}$ as the for-graph-code-redundant-part-calculation data (for-encoding data) 124. Note that the necessary size of the for-graph-code-redundant-part-calculation data (for-encoding data) 124 corresponds to the size g×g of the $\phi^{-1}$. Performing the operation (of numbering the edges of the graph) shown in step S102 in the operation of generating the graph incidence matrix described above using FIG. 3 is for minimizing this g. By minimizing the g, the for-graph-code-redundant-part-calculation data (for-encoding data) 124 generated by the data-for-graph-code-redundant-part-calculation calculator 123 can be minimized.

As such, according to the present embodiment, the graph incidence matrix is divided into the information part and the redundant part, and edges are numbered independently for each part. Thus, the check matrix of the graph code is of an upper right echelon matrix type, and the size of data required for encoding the code is greatly reduced, so that the memory size required in encoding can be reduced. Thus, effective encoding can be performed.

Further, according to the present embodiment, by making the structure of the graph code take the form of an M-partite graph, implementing the encoder 17 can be facilitated. At this time, by making the structure of the graph code take the form of a complete M-partite graph, implementing the encoder 17 can be further facilitated.

(Second Embodiment)

Next, a memory system and a method of controlling a nonvolatile memory according to a second embodiment will be described in detail with reference to the drawings. The present embodiment illustrates the case where BCH codes are used for the component codes of the graph code in the above first embodiment. The structure of the memory system including an encoder according to the present embodiment can be the same as that of the memory system 1 illustrated in the first embodiment, and thus duplicate description thereof is omitted from here. Further, the configuration and operation for calculating the for-graph-code-redundant-part-calculation data (for-encoding data) according to the present embodiment can also be the same as those illustrated in the first embodiment, and thus duplicate description thereof is omitted from here.

For the description of the present embodiment, assume that a non-directed graph G having the number V of vertices and the number E of edges is given and that a BCH code defined by a check matrix $H_{BCH}$ at each vertex is given. Here, let the check matrix $H_{BCH}$ be of a systematic code type. Assume that the edges of the graph G have been numbered by the operation illustrated in the first embodiment, so that an incidence matrix $B_G$ in the form which can be encoded by an RU method has been obtained. Then the check matrix H of a graph code expressed by the following equation (4), which can be encoded by the RU method, can be obtained by the operation of appropriately replacing each nonzero element of $B_G$ with a column vector of $H_{BCH}$. In the equation (4), I is an identity matrix.

$$H = \begin{pmatrix} A & B & I \\ C & D & E \end{pmatrix} \quad (4)$$

Letting N be the code length of the graph code and K be the information length, A is a (N–K–g)×K matrix; B is a (N–K–g)×g matrix; C is a g×K matrix; D is a g×g matrix; and E is a g×(N–K–g) matrix, where g<N–K.

Here, letting $B_G(X)$ denote submatrices of the $B_G$ to be transformed to submatrices X (X=A, B, C, D, E, I) of the H, the $B_G$ is expressed by the following equation (5) on the basis of the equation (4).

$$B_G = \begin{pmatrix} B_G(A) & B_G(B) & B_G(I) \\ B_G(C) & B_G(D) & B_G(E) \end{pmatrix} \quad (5)$$

Let $b_{v,e}(X)$ denote the row-v column-e component of $B_G(X)$. Further, let $V_A$ denote a vertex set corresponding to $B_G(A)$ and $V_C$ denote a vertex set corresponding to $B_G(C)$. Then the code word $c=(i, p_1, p_2)$ of the graph code defined from the check matrix H expressed by the above equation (4) satisfies relational expressions given by the following equations (6) and (7) because $Hc^t=0^t$.

$$p_1^t = -\phi^{-1}(-EA+C)i^t \quad (6)$$

$$p_2^t = -Ai^t - Bp_1^t \quad (7)$$

Here, $\phi=EB+D$, and $\phi^{-1}$ is the inverse matrix of $\phi$. In this description, because a binary code is assumed, there is no distinction between the positive and negative in codes.

Considering the fact that the check matrix H of the graph code expressed by the equation (4) is formed of the check matrix $H_{BCH}$ of the BCH code and that the matrices A, B, C, and E are submatrices of the H, products of matrices and vectors in the equations (6) and (7) can be decomposed into products of submatrices of the $H_{BCH}$ and vectors in calculation.

Here, assume that the systematic-code-type BCH code check matrix $H_{BCH}=[h_1\ h_2\ \ldots\ h_n]$ and a linear feedback shift register (hereinafter called an LFSR) corresponding to the generator polynomial of the BCH code are given. Letting r be the redundant part length of the BCH code, this LFSR is a shift register circuit of feedback connection which r storage elements are connected via a mod-2 adding circuit.

Data is inputted to the LFSR at each clock. Data already stored in the storage elements of the LFSR is shifted one position in the storage elements at each clock. Thus, by inputting an information word or received word to the LFSR, encoding into and decoding the BCH code can be performed. Further, the product of the systematic-code-type check matrix and a vector can also be calculated using the LFSR.

Specifically, the product of the $H_{BCH}$ and a vector $w=(w_1, w_2, \ldots, w_n)$ coincides with a bit series stored in the LFSR when all the elements of w have been sequentially inputted to the LFSR. Here, consider removing s column vectors, i.e., $d_1$-th, $d_2$-th, $\ldots$, $d_s$-th column vectors from the $H_{BCH}$ to create a submatrix $H'_{BCH}=[h'_1\ h'_2\ \ldots\ h'_{n-s}]$ of the $H_{BCH}$. Further, given a vector $v=(v_1, v_2, \ldots, v_{n-s})$ of (n−s) length, with $d_1$-th, $d_2$-th, $\ldots$, $d_s$-th elements being made zero and the other elements being the v, by storing those elements in increasing numerical order starting from the beginning, the vector $w=(w_1, w_2, \ldots, w_n)$ of n length is created. It can be easily ascertained that the product of the $H'_{BCH}$ and the vector v coincides with the product of the $H_{BCH}$ and the vector w. Thus, it is understood that the product of the submatrix $H'_{BCH}$ of the $H_{BCH}$ and the vector v coincides with a bit series stored in the LFSR when all the elements of w defined from the v have been sequentially inputted to the LFSR corresponding to the $H_{BCH}$.

It is understood from the above description that products of matrices and vectors in the equations (6) and (7) can be decomposed into products of submatrices of the $H_{BCH}$ and vectors in calculation and that the calculation can be performed by the LFSR. An encoding algorithm using LFSRs and operation in the circuit in the case where the component codes are BCH codes will be described below. In executing the encoding algorithm, the following seven conditions are assumed. First, an information word $i=(i_1, i_2, \ldots, i_K)$ of K length is given. Second, a BCH code of $n_v$ code length and $r_v$ parity length at each vertex v is determined. Third, a shift register LFSR(v) corresponding to the BCH code determined at each vertex v is prepared. A counter CNT(v) is also prepared which is initialized to 0 at first. Fourth, LFSRs corresponding to the vertex set $V_A$ are called an upper LFSR group, and LFSRs corresponding to the vertex set $V_C$ are called a lower LFSR group. Fifth, a code word memory that is a memory to store a code word of N length is prepared. This memory is divided into an information section 226a to store the information word i of K length, a first parity section 226b to store $p_1$ of g length, and a second parity section 226c to store $p_2$ of (N−K−g) length. Sixth, each bit stored in the code word memory is inputted to each LFSR via a selector. The selector distributes inputted bits according to the incidence matrix $B_G$ of the graph G. Seventh, a $\phi^{-1}$ multiplying circuit outputs the result of computing the product of an inputted vector and $\phi^{-1}$.

FIGS. 18 to 21 are diagrams illustrating an example configuration of an encoding circuit for realizing the encoding algorithm using LFSRs according to the present embodiment. As shown in FIGS. 18 to 21, the encoding circuit 220 comprises a selector 221, an upper LFSR group 222, a lower LFSR group 223, a $\phi^{-1}$ multiplying circuit 224, a vector adder 225, and a code word memory 226.

Figure 18:
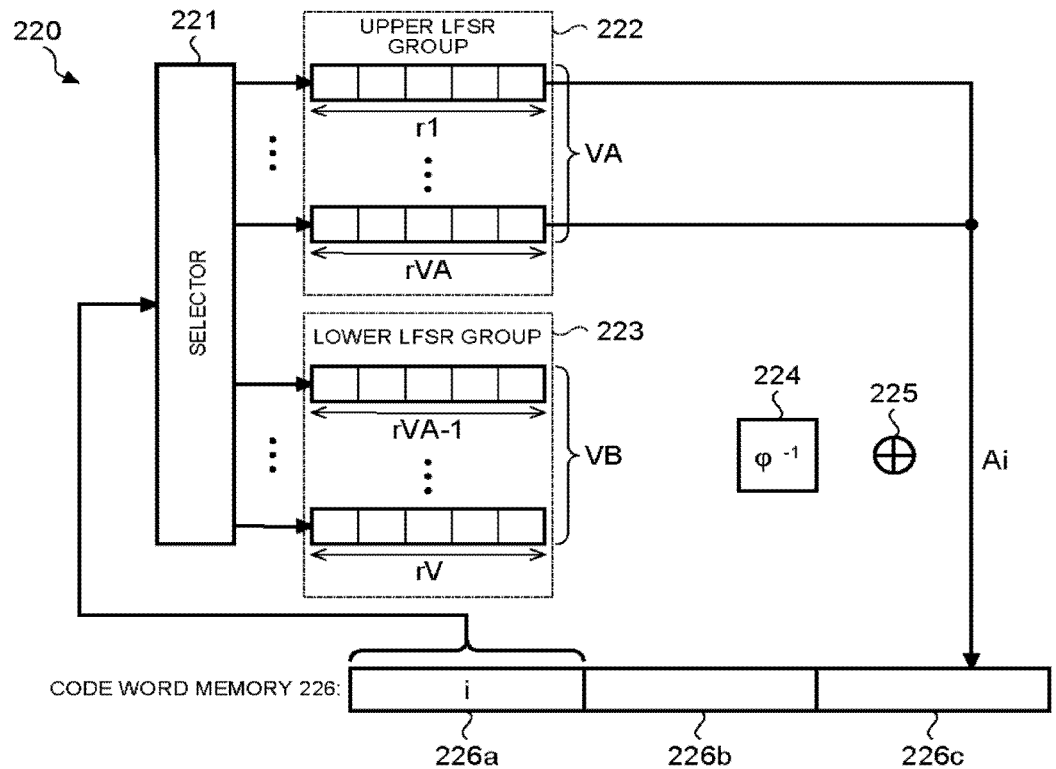
FIG. 18 is a diagram illustrating an example configuration of an encoding circuit for realizing an encoding algorithm using LFSRs according to a second embodiment (No. 1)

In the encoding algorithm using LFSRs realized by the encoding circuit 220 shown in FIGS. 18 to 21, first, submatrices $Ai^t$ and $Ci^t$ are calculated. In this calculation, as shown in FIG. 18, first, the information word $i=(i_1, i_2, \ldots, i_K)$ stored in the information section 226a in the code word memory 226 are sequentially inputted to the selector 221 in increasing element numerical order. When $i_j$ is inputted, the selector 221 selects LFSR(v) for which $b_{v,j}(A)=1$ or $b_{v,j}(C)=1$ to input $i_j$ thereto. At this time, the counter CNT(v) (not shown) is incremented by 1.

Next, when the entire information word i has been inputted to the selector 221, a zero is inputted to the upper LFSR group 222 ($n_v$−CNT(V)) times. Thus, the result of computing $Ai^t=(a_1, a_2, \ldots, a_{N-K-g})_t$ is stored in the upper LFSR group 222. Meanwhile, an unfinished result of computing $Ci^t$ is stored in the lower LFSR group 223.

Then $Ai^t$ stored in the upper LFSR group 222 is stored into second parity section 226c of the code word memory 226.

Figure 19:
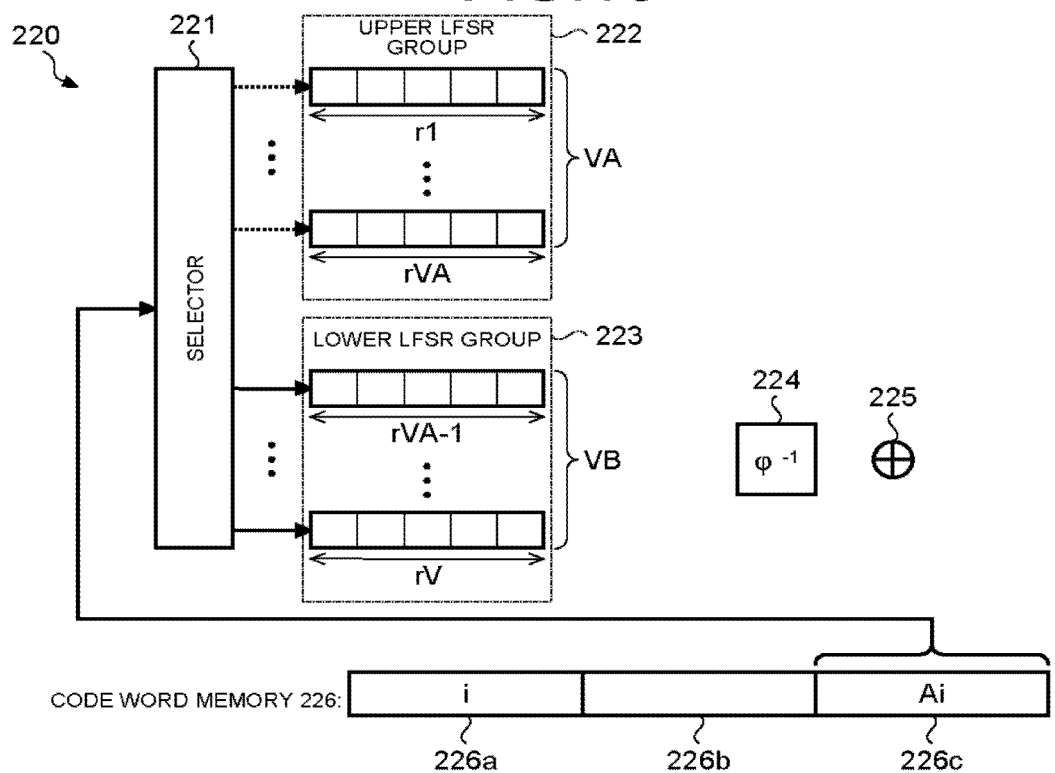
FIG. 19 is a diagram illustrating an example configuration of an encoding circuit for realizing an encoding algorithm using LFSRs according to the second embodiment (No. 2)

Then the encoding algorithm using LFSRs calculates $E(Ai^t)+Ci^t$. In this calculation, as shown in FIG. 19, first, $Ai^t=(a_1, a_2, \ldots, a_{N-K-g})^t$ stored in the second parity section 226c of the code word memory 226 are sequentially inputted to the selector 221 in increasing element numerical order. When $i_j$ is inputted, the selector 221 selects LFSR(v) of the lower LFSR group 223 for which $b_{v,j}(E)=1$ to input $i_j$ thereto. At this time, the counter CNT(v) (not shown) is incremented by 1. Note that the counter CNT(v) was incremented during the calculation of $Ci^t$ and further incremented here.

Next, when the entire $Ai^t$ has been inputted to the selector 221, a zero is inputted to the lower LFSR group 223 ($n_v$−c(v)) times. Thus, the result of computing $E(Ai^t)+Ci^t$ is stored in the lower LFSR group 223. Note that the sum of $Ci^t$ and $E(Ai^t)$ is calculated using the linearity of the LFSR.

Figure 20:
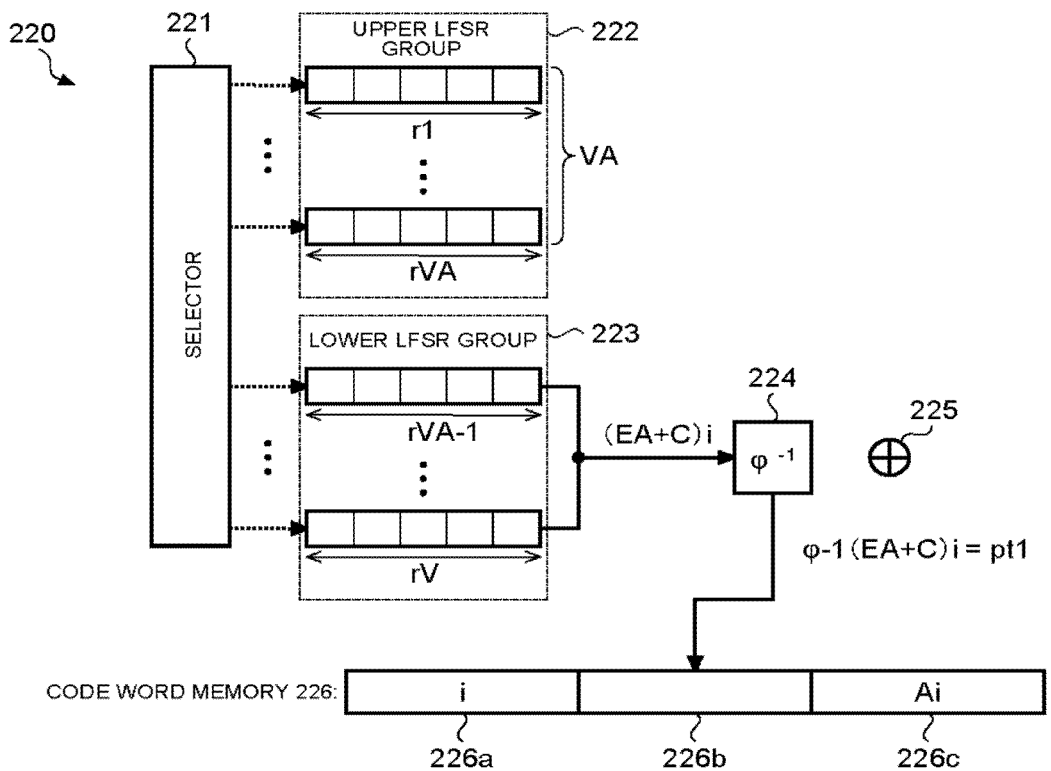
FIG. 20 is a diagram illustrating an example configuration of an encoding circuit for realizing an encoding algorithm using LFSRs according to the second embodiment (No. 3)

Then the encoding algorithm using LFSRs calculates $p^t_1=\phi^{-1}(EA+C)i^t$. In this calculation, as shown in FIG. 20, first, $(EA+C)i^t$ stored in the lower LFSR group 223 is inputted to the $\phi^{-1}$ multiplying circuit 224 to calculate $\phi^{-1}(EA+C)i^t$. The calculated $p^t_1=\phi^{-1}(EA+C)i^t$ is stored into the first parity section 226b of the code word memory 226.

Figure 21:
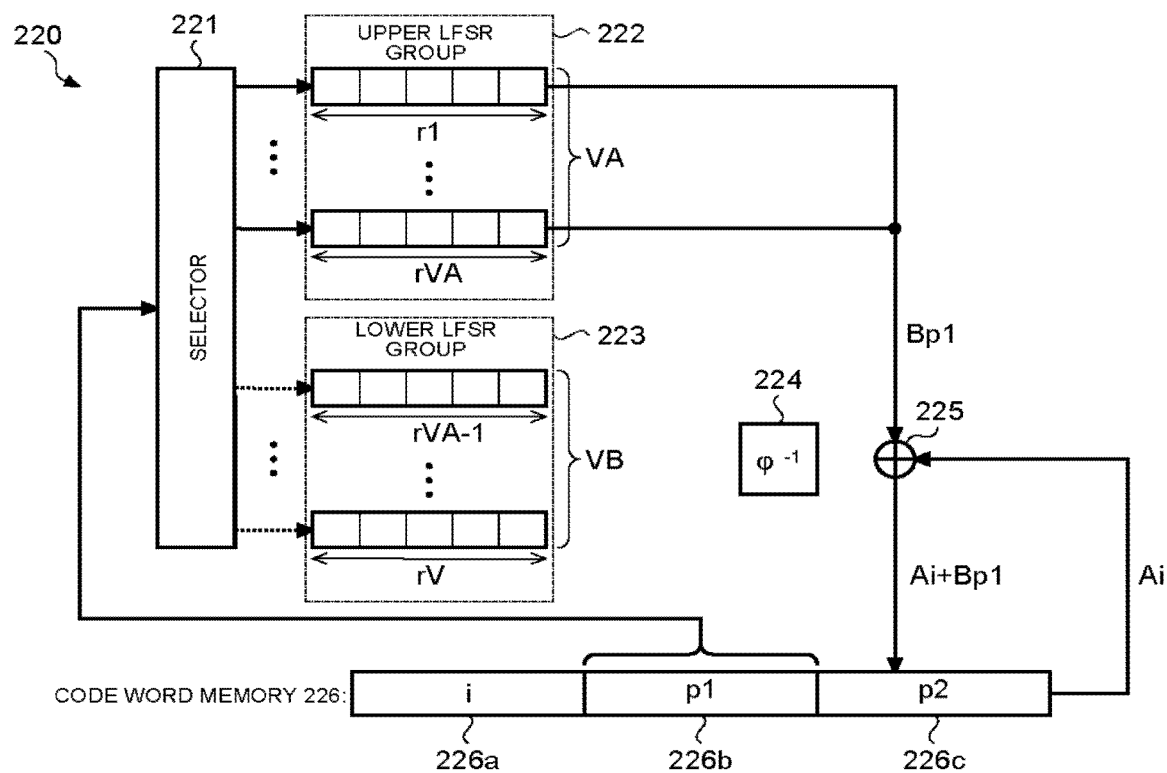
FIG. 21 is a diagram illustrating an example configuration of an encoding circuit for realizing an encoding algorithm using LFSRs according to the second embodiment (No. 4)

Then the encoding algorithm using LFSRs calculates $p^t_2=Ai^t+Bp^t_1$. In this calculation, as shown in FIG. 21, first, $p_1=(q_1, q_2, \ldots, q_g)$ stored in the first parity section 226b of the code word memory 226 are sequentially inputted to the selector 221 in increasing element numerical order. When $q_j$ is inputted, the selector 221 selects LFSR(v) of the upper LFSR group 222 for which $b_{v,j}(B)=1$ to input $q_j$ thereto.

Then, when the entire $p_1$ has been inputted, a zero is inputted to the upper LFSR group 222 $p_v$ times. Thus, the result of computing $Bp^t_1$ is stored in the upper LFSR group 222.

Then $Bp^t_1$ stored in the upper LFSR group 222 and $Ai^t$ stored in the second parity section 226c of the code word memory 226 are inputted to the vector adder 225 to calculate an exclusive OR of $Bp^t_1$ and $Ai^t$, and the result is stored into the second parity section 226c of the code word memory 226. Thus, the result of computing $p^t_2=Ai^t+Bp^t_1$ is stored in the second parity section 226c of the code word memory 226.

The operation described above is the encoding algorithm of the graph code using LFSRs according to the present embodiment. If the check matrix H of the graph code decreases in rank, in addition to the above operation, the following operation is performed.

First, let L be the number of dependent rows of the check matrix H. A list $s=(s1, s2, \ldots, sL)$ of vertex numbers and row numbers $r=(r1, r2, \ldots, rL)$ of the $H_{BCH}$ corresponding to the dependent rows of the check matrix H are stored. Second, in the calculation of the above encoding algorithm, when the computing result of LFSR($s_j$) (j=1, 2, . . . , L) is outputted, the value in the $r_j$-th storage element is not outputted.

By performing the above additional operation, the result of calculating a matrix obtained by removing dependent rows from the check matrix H and a vector can be obtained.

Figure 12:
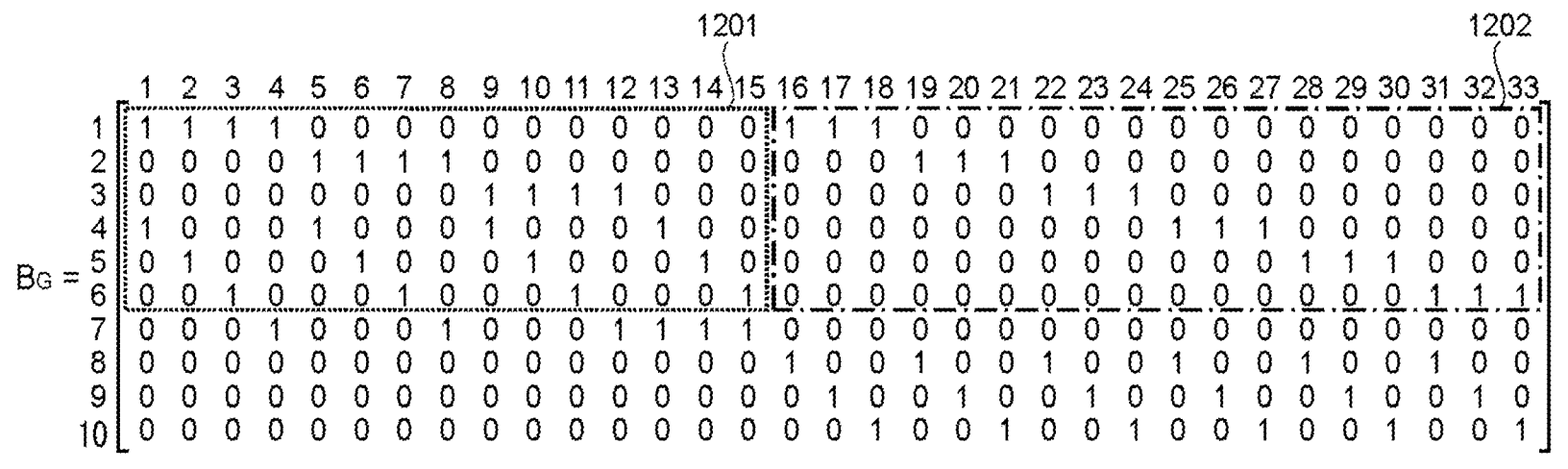
Figure 22:
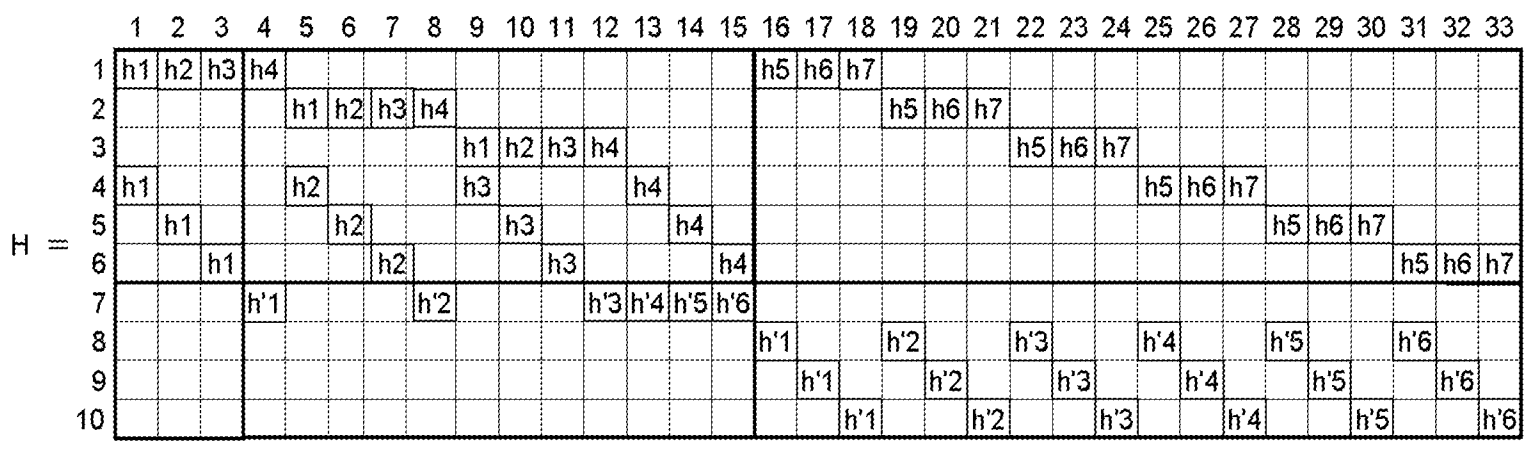

Next, the encoding method using LFSRs will be described taking as an example a graph code determined for the tripartite graph of which the number of vertices is ten, illustrated using FIG. 4 in the first embodiment. In this description, as the incidence matrix, the one illustrated in FIG. 12 is used, and it is assumed that for vertices 1 to 6, a BCH code defined from the check matrix illustrated in FIG. 13 is chosen and that for vertices 7 to 10, a BCH code defined from the check matrix illustrated in FIG. 14 is chosen. Then the check matrix H of the graph code is represented as in FIG. 22. In this case, for vertices 1 to 6, a BCH code of 7 in code length is chosen, and for vertices 7 to 10, a BCH code of 6 in code length is chosen. And the information length K of the graph code is 3; the code length N is 33; and the gap g is 12.

Encoding using LFSRs can be performed by the operation below when the above algorithm is followed.

Calculation of $Ai^t$, $Ci^t$

First, in the calculation of submatrices $Ai^t$ and $Ci^t$ (see FIG. 18), the information word $i=(i_1, i_2, i_3)$ stored in the information section 226a in the code word memory 226 are sequentially inputted to the selector 221 in increasing element numerical order and stored in the upper LFSR group 222. Specifically, $i_1$ is stored in LFSR(1) and LFSR(4); $i_2$ is stored in LFSR(1) and LFSR(5); and $i_3$ is stored in LFSR(1) and LFSR(6).

Then, when the entire information word i has been inputted, a zero is inputted to LFSR(1) four times, and a zero is inputted to LFSR(4), LFSR(5), and LFSR(6) six times.

By this means, the result of calculating $Ai^t=(a_1, a_2, \ldots, a_{18})^t$ is stored in LFSR(1) to LFSR(6) forming the upper LFSR group 222. As to $Ci^t$, because C is a zero matrix, a computing result of zero is stored. The result obtained in this way is stored into the second parity section 226c of the code word memory 226.

Calculation of $(EA+C)i^t$

Next, in the calculation of $E(Ai^t)+Ci^t$ (see FIG. 19), $Ai^t=(a_1, a_2, \ldots, a_{18})^t$ stored in the second parity section 226c of the code word memory 226 are sequentially inputted to the selector 221 in increasing element numerical order and stored in the lower LFSR group 223. Specifically, $a_1$ is stored in LFSR(8); $a_2$ is stored in LFSR(9); $a_3$ is stored in LFSR(10); and the same operation is performed on $a_4$ to $a_{18}$.

By this means, the result of computing $(EA+C)i^t$ is stored in LFSR(7) to LFSR(10) forming the lower LFSR group 223. In this case, zeros need not be inputted to shift registers.

Calculation of $p^t_1=\phi^{-1}(EA+C)i^t$

Next, in the calculation of $p^t_1=\phi^{-1}(EA+C)i^t$ (see FIG. 20), $\phi^{-1}$ is multiplied by $(EA+C)i^t$ stored in LFSR(7) to LFSR(10). Thereby, $p^t_1$ is obtained. The obtained calculating result is stored into the first parity section 226b of the code word memory 226.

Calculation of $p^t_2=Ai^t+Bp^t_1$

Next, in the calculation of $p^t_2=Ai^t+Bp^t_1$ (see FIG. 21), $p_1=(q_1, q_2, \ldots, q_{12})$ stored in the first parity section 226b of the code word memory 226 are sequentially inputted to the selector 221 in increasing element numerical order and stored in the upper LFSR group 222. Specifically, $q_1$ is stored in LFSR(1); $q_2$ is stored in LFSR(2) and LFSR(4); and the same operation is performed on $q_3$ to $q_{12}$. Then, when the entire $p_1$ has been inputted, a zero is inputted to each of LFSR(1) to LFSR(6) three times.

By this means, the result of computing $p^t_2=Ai^t+Bp^t_1$ is stored in LFSR(1) to LFSR(6). An exclusive OR of this result and $Ai^t$ stored in the second parity section 226c of the code word memory 226 is computed, and the computing result is stored into the second parity section 226c of the code word memory 226. Thus, the result of computing $p^t_2=Ai^t+Bp^t_1$ is stored in the second parity section 226c of the code word memory 226.

As described above, according to the present embodiment, also in the case where BCH codes are used as the component codes, computing for encoding can be performed efficiently as in the first embodiment. Because the other configuration, operations, and effects are the same as in the above embodiment, detailed description thereof is omitted from here.

(Third Embodiment)

Next, a memory system and a method of controlling a nonvolatile memory according to a third embodiment will be described in detail with reference to the drawings. The above embodiments illustrate the case where each two vertices of the graph are connected by one edge. In contrast, in the third embodiment, description will be made taking as an example the case where each two vertices of the graph are connected by a plurality of edges. The structure of the memory system including an encoder according to the present embodiment can be the same as that of the memory system 1 illustrated in the first embodiment, and thus duplicate description thereof is omitted from here. Further, the configuration and operation of the encoder 17 according to the present embodiment can also be fundamentally the same as those illustrated in the first embodiment, and thus duplicate description thereof is omitted from here. In the present embodiment, the same algorithm as is illustrated in the first embodiment, is followed with duplicate description thereof being omitted, and in the description below, specific operation for obtaining the check matrix of the graph code is focused on.

Figures 23, 24:
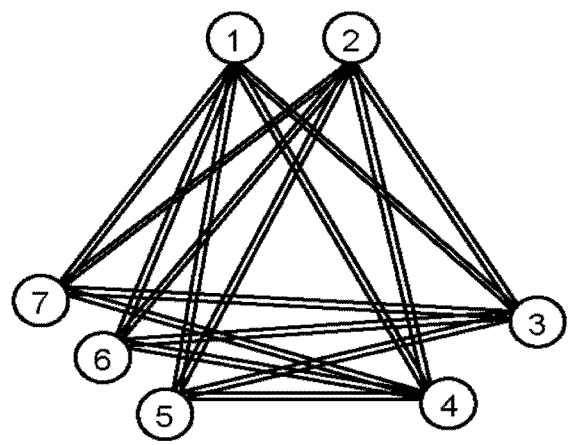
FIG. 23 is a diagram illustrating the graph structure of a graph in a third embodiment.
FIG. 24 is a diagram illustrating an example adjacency matrix of the graph shown in FIG. 23.

First, the operation of obtaining the adjacency matrix of the graph in the present embodiment will be described. In the present embodiment, assuming that a graph shown in, e.g., FIG. 23 is given, its adjacency matrix is expressed as in FIG. 24. Because each two vertices are connected by two edges as shown in FIG. 23, two is stored in the adjacency matrix $A_G$ as shown in FIG. 24. Here, numerals inside open circles in FIG. 23 represent respective vertex numbers, and the assigned numerals outside the matrix in FIG. 24 denote the numbers of the vertices to which the rows or the columns correspond respectively. Further, it is assumed that the graph shown in FIG. 23 is a complete tripartite graph where two edges exist between each two vertices.

Next, the operation of numbering the edges of the graph will be described. In this description, classifying the edges and numbering the edges are performed simultaneously. The edges included in the information part edge set are numbered incrementally in the order in which the edges were included in this set. The operation of numbering the edges of the graph shown in FIG. 23 under the condition that the redundant part length of the component code at each vertex is four will be described using drawings.

Numbering the edges connecting to the first vertex is shown as in FIG. 25. Since the redundant part length is four, four edges behind from among the edges connecting to vertex 1 are included in the redundant part edge set. Likewise, numbering the edges connecting to the second vertex is shown as in FIG. 26. The same operation is repeated on all the remaining vertices 3 to 7, so that all the edges can be numbered. When this is performed by replacing elements of the adjacency matrix, the finally obtained matrix is expressed as in FIG. 27. Here, the part 2701 surrounded by the dotted-line frame denotes edges corresponding to the information parts of component codes, and the part 2702 surrounded by the dot-dashed line frame denotes edges corresponding to the redundant parts of the component codes.

Next, the operation of obtaining an incidence matrix of the graph will be described. The incidence matrix $B_G$ of the graph shown in FIG. 23 is expressed as in FIG. 28. Note that an assigned numeral outside the matrix denotes, for a row, the number of the vertex to which the row corresponds and, for a column, the number of the edge to which the column corresponds.

Next, the operation of obtaining a check matrix of a graph code will be described. Assume that the incidence matrix of the graph is expressed as in FIG. 28 and that the check matrix of the component code at each vertex of the graph is given as shown in FIG. 29 for vertices 1 to 4 and given as shown in FIG. 30 for vertices 5 to 7. Here, in FIG. 28, the part 2801 surrounded by the dotted-line frame denotes the part corresponding to the information-part edge set, and the part 2802 surrounded by the dot-dashed line frame denotes the part corresponding to the redundant-part edge set. In FIGS. 29 and 30, the parts 2901 and 3001 surrounded by the dotted-line frames denote the information part, and the parts 2902 and 3002 surrounded by the dot-dashed line frames denote the redundant part. In this case, the check matrix H of the graph code is given as shown in FIG. 31.

As shown in FIG. 31, it is understood that the part 3101 corresponding to the information part of the incidence matrix surrounded by the dotted-line frame is replaced with the information part 3111 of the component code check matrix and that the part 3102 corresponding to the redundant part surrounded by the dot-dashed line frame is replaced with the redundant part 3112 of the component code check matrix. This corresponds to the information part of the component code check matrix acting on the information part of the graph incidence matrix and the redundant part of the component code check matrix acting on the redundant part of the graph incidence matrix in the data-for-encoding creating unit 100 shown in FIG. 2.

Thus, the check matrix H of the graph code in the present embodiment is expressed by the following equation (8). Here, I is an identity matrix.

$$H = \begin{pmatrix} A & B & I \\ C & D & E \end{pmatrix} \qquad (8)$$

As described above, according to the present embodiment, also in the case of a graph code in which a plurality of edges extend between two vertices, data required for encoding of the graph code can be minimized as in the first embodiment. Because the other configuration, operations, and effects are the same as in the above embodiments, detailed description thereof is omitted from here.

(Fourth Embodiment)

Next, a memory system and a method of controlling a nonvolatile memory according to a fourth embodiment will be described in detail with reference to the drawings. In the fourth embodiment, the case of obtaining the check matrix of the graph code of a more general graph than in the above embodiments is illustrated. The structure of the memory system including an encoder according to the present embodiment can be the same as that of the memory system 1 illustrated in the first embodiment, and thus duplicate description thereof is omitted from here. Further, the configuration and operation of the encoder 17 according to the present embodiment can also be fundamentally the same as those illustrated in the first embodiment, and thus duplicate description thereof is omitted from here. In the present embodiment, the same algorithm as is illustrated in the first embodiment, is followed with duplicate description thereof being omitted, and in the description below, specific operation for obtaining the check matrix of the graph code of a more general graph is discussed.

Figures 32, 33:
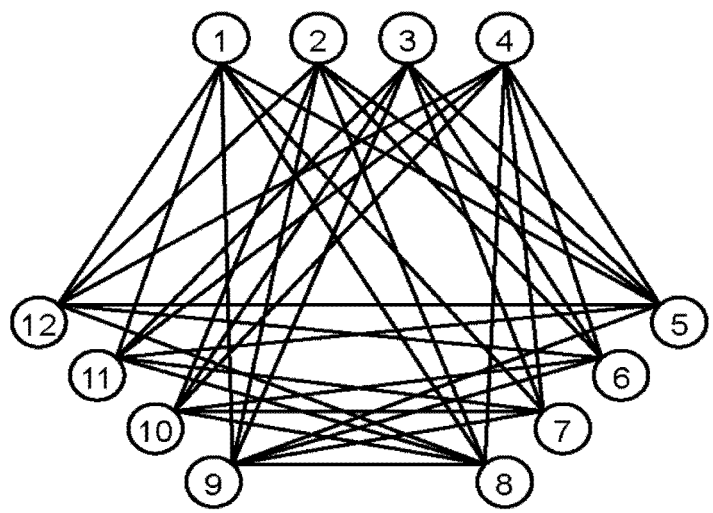
FIG. 32 is a diagram illustrating the graph structure of a graph in a fourth embodiment.
FIG. 33 is a diagram illustrating an example adjacency matrix of the graph shown in FIG. 32.

First, the operation of obtaining the adjacency matrix of the graph in the present embodiment will be described. In the present embodiment, when a graph shown in, e.g., FIG. 32 is given, its adjacency matrix is expressed as in FIG. 33. As shown in FIG. 33, zero elements exist also in other areas than diagonal block part in the adjacency matrix $A_G$ according to the present embodiment unlike the above first and second embodiments. Here, numerals inside open circles in FIG. 32 represent respective vertex numbers, and the assigned numerals outside the matrix in FIG. 33 denote the numbers of the vertices to which the rows or the columns correspond respectively. Further, it is assumed that the graph shown in FIG. 32 is an incomplete tripartite graph.

Next, the operation of numbering the edges of the graph will be described. In this description, classifying the edges and numbering the edges are performed simultaneously. The edges included in the information part edge set are numbered incrementally in the order in which the edges were included in this set. The operation of numbering the edges of the graph shown in FIG. 32 under the condition that the redundant part length of the component code at each vertex is four will be described using drawings.

Figure 34:
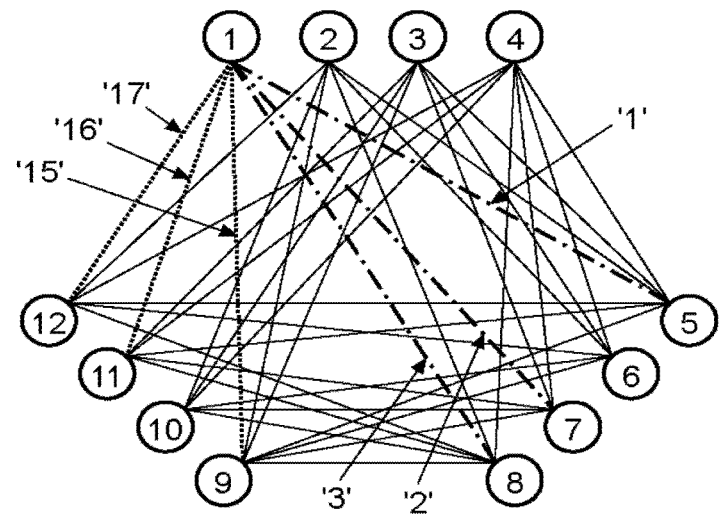
FIG. 34 is a diagram illustrating an example for explaining the numbering of edges according to the fourth embodiment.
Figure 35:
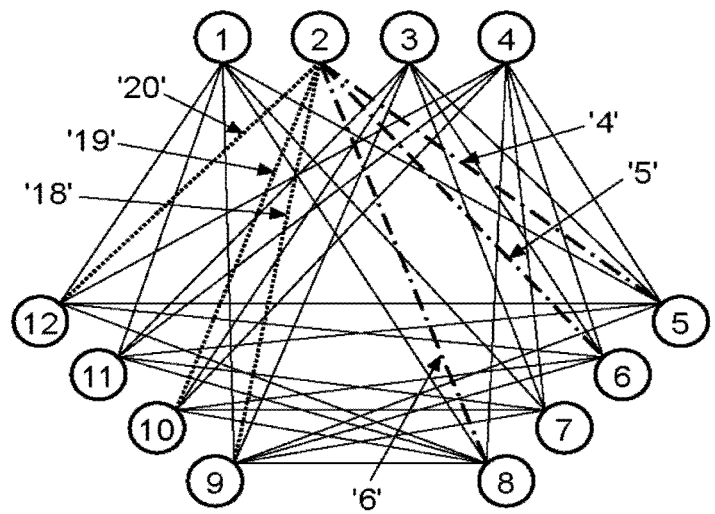
FIG. 35 is a diagram illustrating another example for explaining the numbering of edges according to the fourth embodiment.

First, numbering the edges connecting to the first vertex is shown as in FIG. 34. Numbering the edges connecting to the second vertex is shown as in FIG. 35. The same operation is repeated on all the remaining vertices, so that the finally obtained matrix is expressed as in FIG. 36. Here, the part 3601 surrounded by the dotted-line frame denotes edges corresponding to the information parts of component codes, and the part 3602 surrounded by the dot-dashed line frame denotes edges corresponding to the redundant parts of the component codes.

Figure 37:
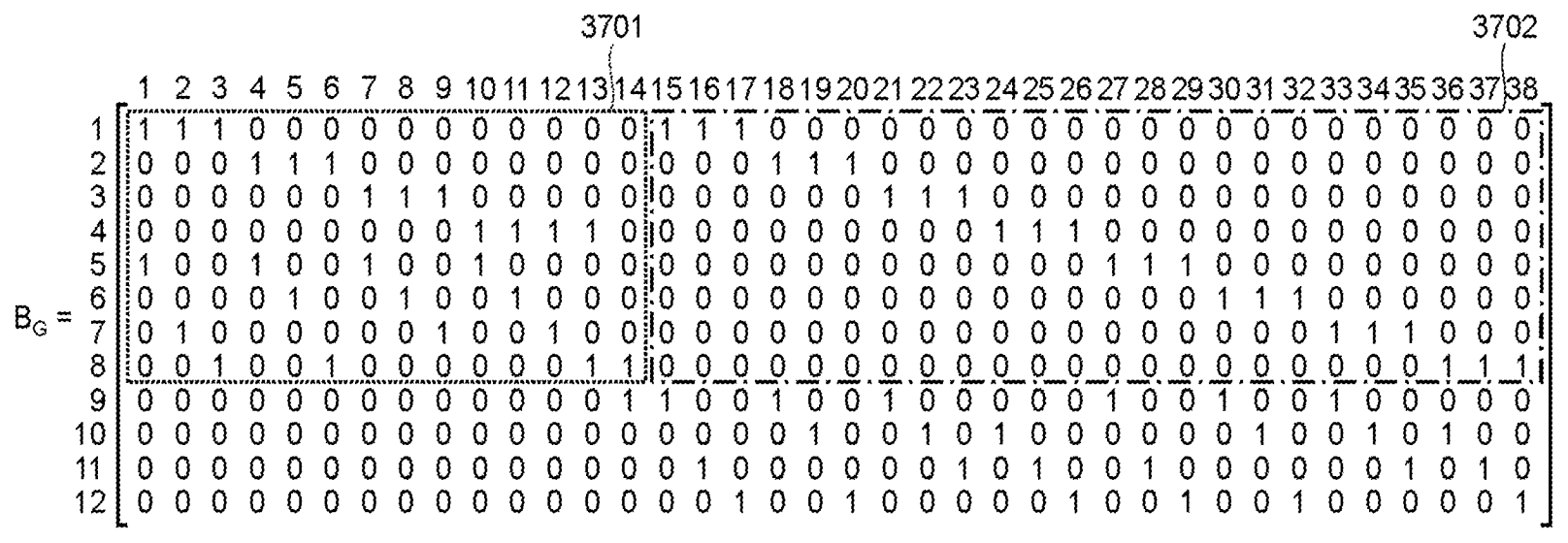

Next, the operation of obtaining an incidence matrix of the graph will be described. The incidence matrix $B_G$ of the graph shown in FIG. 32 is expressed as in FIG. 37. Here, the part 3701 surrounded by the dotted-line frame denotes the part corresponding to the information-part edge set, and the part 3702 surrounded by the dot-dashed line frame denotes the part corresponding to the redundant-part edge set. Note that an assigned numeral outside the matrix denotes, for a row, the number of the vertex to which the row corresponds and, for a column, the number of the edge to which the column corresponds.

Next, the operation of obtaining a check matrix of a graph code will be described. Assume that the incidence matrix of the graph is expressed as in FIG. 37 and that the check matrix of the component code at each vertex of the graph is given as shown in FIG. 13 for vertices 4, 5, 8, and 9 and given as shown in FIG. 14 for the other vertices. In this case, the check matrix H of the graph code is given as shown in FIG. 38.

As shown in FIG. 38, it is understood that the part 3801 corresponding to the information part of the incidence matrix surrounded by the dotted-line frame is replaced with the information part 3811 of the component code check matrix and that the part 3802 corresponding to the redundant part surrounded by the dot-dashed line frame is replaced with the redundant part 3812 of the component code check matrix. This corresponds to the information part of the component code check matrix acting on the information part of the graph incidence matrix and the redundant part of the component code check matrix acting on the redundant part of the graph incidence matrix in the data-for-encoding creating unit 100 shown in FIG. 2.

Thus, the check matrix H of the graph code in the present embodiment is expressed by the following equation (9). Here, I is an identity matrix.

$$H = \begin{pmatrix} A & B & I \\ C & D & E \end{pmatrix} \quad (9)$$

As described above, according to the present embodiment, also in the case of a general graph code, computing for encoding can be performed efficiently as in the first embodiment. Because the other configuration, operations, and effects are the same as in the above embodiments, detailed description thereof is omitted from here. Although in the present embodiment only the example where an edge of a graph connects to two vertices is described, an edge of a graph may connect to two or more vertices in the above embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system which can be connected to a host, comprising:
   a nonvolatile memory;
   an encoder configured to encode at least a part of user data received from the host as an information word by a graph code;
   an encode data holding unit configured to hold for-encoding data to be used when the encoder encodes the information word; and
   a memory interface configured to write a code word subjected to the encoding into the nonvolatile memory,
   wherein a check matrix of the graph code is a matrix whose upper tier is formed of first, second, and sixth submatrices and whose lower tier is formed of third to fifth submatrices, the sixth submatrix being an identity matrix,
   wherein the encoder:
   produces a first vector obtained by multiplying the information word and the first submatrix,
   produces a second vector obtained by multiplying the information word and the third submatrix,
   produces a third vector obtained by multiplying the first vector and the fifth submatrix inverted in sign,
   produces a fourth vector obtained by adding the third vector and the second vector,
   produces a first parity obtained by multiplying the fourth vector and the for-encoding data,
   produces a fifth vector obtained by multiplying the first parity and the second submatrix inverted in sign,
   produces a second parity obtained by adding the fifth vector and the first vector, and
   wherein the memory interface writes the information word, the first parity, and the second parity as the code word into the nonvolatile memory, and
   wherein the for-encoding data is data based on the second submatrix, the fourth submatrix, and the fifth submatrix.

2. The memory system according to claim 1, wherein the check matrix is of a systematic code type.

3. The memory system according to claim 1, wherein the encoder comprises:
   a first multiplying unit configured to multiply the information word and the first submatrix to calculate the first vector;
   a second multiplying unit configured to multiply the information word and the third submatrix to calculate the second vector;
   a third multiplying unit configured to multiply the first vector and the fifth submatrix to calculate the third vector;
   a first adding unit configured to add the third vector and the second vector to calculate the fourth vector;
   a fourth multiplying unit configured to multiply the fourth vector and the for-encoding data to calculate the first parity;
   a fifth multiplying unit configured to multiply the first parity and the second submatrix to calculate the fifth vector; and
   a second adding unit configured to add the fifth vector and the first vector to calculate the second parity.

4. The memory system according to claim 1, wherein one or more component codes among a plurality of component codes forming the graph code are Bose-Chaudhuri-Hocquenghem (BCH) codes, wherein the encoder comprises:
at least a corresponding number of shift registers to generator polynomials of the one or more BCH codes;
a selector configured to distribute the information word to the shift registers;
a multiplier;
an adder; and
a code word memory configured to store the information word, the first parity, and the second parity,
wherein the shift registers include a first shift register group formed of a plurality of shift registers and a second shift register group formed of a plurality of other shift registers,
wherein the selector inputs the information word stored in the code word memory to the first shift register group,
wherein the first shift register group calculates the first vector in response to input of the information word by the selector,
wherein the code word memory stores the first vector calculated by the first shift register group,
wherein the selector inputs the first vector stored in the code word memory to the second shift register group,
wherein the second shift register group calculates the second and third vectors and the fourth vector in response to input of the first vector by the selector,
wherein the multiplier calculates the fourth vector calculated by the second shift register group by the for-encoding data, thereby calculating the first parity,
wherein the code word memory stores the first parity calculated by the multiplier,
wherein the selector inputs the first parity stored in the code word memory to the first shift register group,
wherein the first shift register group calculates the fifth vector in response to input of the first parity by the selector,
wherein the adder adds the fifth vector calculated by the first shift register group and the first vector stored in the code word memory, thereby calculating the second parity, and
wherein the code word memory stores the second parity calculated by the adder.

5. The memory system according to claim 1, wherein the for-encoding data is an inverse matrix of a submatrix obtained by adding the fourth submatrix to a sixth vector obtained by inverting, in sign, a submatrix obtained by multiplying the fifth submatrix and the second submatrix.

6. The memory system according to claim 1, wherein the for-encoding data is data obtained by:
generating an incidence matrix using data determining a graph structure of the graph code via an adjacency matrix,
calculating a check matrix for the graph code from a check matrix of a component code at each vertex in the graph structure and the incidence matrix, and
calculating the for-encoding data using the check matrix for the graph code.

7. The memory system according to claim 6, wherein the graph structure comprises a structure where each two vertices are connected by a plurality of edges.

8. The memory system according to claim 6, wherein the graph structure is an M-partite graph.

9. The memory system according to claim 6, wherein the graph structure is a complete M-partite graph.

10. A method of controlling a nonvolatile memory, comprising:
receiving user data from a host;
producing a first vector obtained by multiplying an information word that is at least a part of the received user data and first submatrix of first to sixth submatrices included in a check matrix of a graph code for encoding the information word, the check matrix being a matrix whose upper tier is formed of the first, second and sixth submatrices and whose lower tier is formed of the third to fifth submatrices, the sixth submatrix being an identity matrix;
producing a second vector obtained by multiplying the information word and the third submatrix;
producing a third vector obtained by multiplying the first vector and the fifth submatrix inverted in sign;
producing a fourth vector obtained by adding the third vector and the second vector;
producing a first parity obtained by multiplying for-encoding data prepared beforehand and the fourth vector;
producing a fifth vector obtained by multiplying the first parity and the second submatrix inverted in sign;
producing a second parity obtained by adding the fifth vector and the first vector; and
writing the information word, the first parity, and the second parity as a code word into the nonvolatile memory,
wherein the for-encoding data is data based on the second submatrix, the fourth submatrix, and the fifth submatrix.

11. The method according to claim 10, wherein the check matrix is of a systematic code type.

12. The method according to claim 10, wherein the for-encoding data is data obtained by:
generating an incidence matrix using data determining a graph structure of the graph code via an adjacency matrix,
calculating a check matrix for the graph code from a check matrix of a component code at each vertex in the graph structure and the incidence matrix, and
calculating the for-encoding data using the check matrix for the graph code.

13. The method according to claim 12, wherein the graph structure comprises a structure where each two vertices are connected by a plurality of edges.

14. The method according to claim 12, wherein the graph structure is an M-partite graph.

15. The method according to claim 12, wherein the graph structure is a complete M-partite graph.

* * * * *